United States Patent

Savas

[11] Patent Number: 5,964,949
[45] Date of Patent: Oct. 12, 1999

[54] ICP REACTOR HAVING A CONICALLY-SHAPED PLASMA-GENERATING SECTION

[75] Inventor: Stephen E. Savas, Alameda, Calif.

[73] Assignee: Mattson Technology, Inc., Fremont, Calif.

[21] Appl. No.: 08/811,893

[22] Filed: Mar. 5, 1997

Related U.S. Application Data

[60] Provisional application No. 60/012,932, Mar. 6, 1996.

[51] Int. Cl.$^6$ .................................................. C23C 16/00
[52] U.S. Cl. .......................................... 118/723 I; 156/345
[58] Field of Search ............................. 118/723 R, 723 I, 118/723 IR, 723 E, 723 ER, 723 AN; 156/345; 315/111.51

[56] References Cited

U.S. PATENT DOCUMENTS

| | | | |
|---|---|---|---|
| 4,948,458 | 8/1990 | Ogle | 156/643 |
| 5,234,529 | 8/1993 | Johnson | 156/345 |
| 5,280,154 | 1/1994 | Cuomo et al. | 219/121.52 |
| 5,346,578 | 9/1994 | Benzing et al. | 156/345 |
| 5,401,350 | 3/1995 | Patrick et al. | 156/345 |
| 5,405,480 | 4/1995 | Benzing et al. | 156/345 |
| 5,449,432 | 9/1995 | Hanawa | 156/643.1 |
| 5,540,800 | 7/1996 | Qian | 156/345 |
| 5,540,824 | 7/1996 | Yin et al. | 204/298.34 |
| 5,556,521 | 9/1996 | Ghanbari | 204/192.32 |
| 5,558,722 | 9/1996 | Okumura et al. | 118/723 I |
| 5,565,074 | 10/1996 | Qian et al. | 204/298.08 |
| 5,571,366 | 11/1996 | Ishii et al. | 156/345 |
| 5,614,055 | 3/1997 | Fairbairn et al. | 156/345 |
| 5,647,913 | 7/1997 | Blalock | 118/723 I |
| 5,683,539 | 11/1997 | Qian et al. | 156/345 |
| 5,688,357 | 11/1997 | Hanawa | 156/345 |
| 5,690,781 | 11/1997 | Yoshida et al. | 156/345 |
| 5,696,428 | 12/1997 | Pasch | 315/111.21 |
| 5,710,486 | 1/1998 | Ye et al. | 315/111.21 |
| 5,753,044 | 5/1998 | Hanawa et al. | 118/723 I |
| 5,777,289 | 7/1998 | Hanawa et al. | 219/121.43 |
| 5,811,022 | 9/1998 | Savas et al. | 216/68 |

FOREIGN PATENT DOCUMENTS

| | | | |
|---|---|---|---|
| 0 694 949 A2 | 1/1996 | European Pat. Off. | H01J 37/32 |
| 6-196446 | 7/1994 | Japan . | |
| WO 91/10341 | 7/1991 | WIPO | H05H 1/24 |

OTHER PUBLICATIONS

Corresponding PCT application No. PCT/US97/04756 filed Mar. 5, 1997, PCT International Search Report, citing the above–listed references.

N. Shoda et al., "Water Absorption Study of High Density Plasma CVD Oxide Films," Feb. 20–21, 1996 DUMIC Conference, 1996 ISMIC—111D/96/0013.

M. Tuszewski et al., "Composition of the oxygen plasmas from two inductively coupled sources," J. Vac. Sci. Technol. A 13(3), May/Jun. 1995, pp. 839–842.

P. N. Wainman et al., "Characterization at different aspect ratios (radius/length) of a radio frequency inductively coupled plasma source," J. Vac. Sci. Technol. A 13(5), Sep./Oct. 1995, pp. 2464–2469.

*Primary Examiner*—Bruce Breneman
*Assistant Examiner*—Luz Alejandro
*Attorney, Agent, or Firm*—Wilson Sonsini Goodrich & Rosati

[57] ABSTRACT

Disclosed is an inductively-coupled plasma reactor that is useful for anisotropic or isotropic etching of a substrate, or chemical vapor deposition of a material onto a substrate. The reactor has a plasma-generation chamber with a conically-shaped plasma-generating portion and coils that are arranged around the plasma-generating portion in a conical spiral. The chamber and coil may be configured to produce a highly uniform plasma potential across the entire surface of the substrate to promote uniform ion bombardment for ion enhanced processing. In addition, a conical chamber and coil configuration may be used to produce activated neutral species at varying diameters in a chamber volume for non-ion enhanced processing. Such a configuration promotes the uniform diffusion of the activated neutral species across the wafer surface.

34 Claims, 8 Drawing Sheets

5,964,949

ICP REACTOR HAVING A CONICALLY-SHAPED PLASMA-GENERATING SECTION

REFERENCE TO RELATED APPLICATION

The present application claims priority from provisional application Ser. No. 60/012,932 filed Mar. 6, 1996. Provisional application Ser. No. 60/012,932 is hereby incorporated herein by reference in its entirety.

BACKGROUND

FIELD OF THE INVENTION

Plasma-generating reactors have been used extensively in processes for fabricating integrated circuit or microelectromechanical (MEM) devices from a substrate such as a silicon wafer. One particularly useful reactor is the inductively-coupled plasma-generating (ICP) reactor, which inductively (and to some extent capacitively) couples radio frequency (RF) power into a gas contained within the reactor to generate a plasma. The plasma contains species such as ions, free radicals, and excited atoms and molecules that may be used to process the substrate and ultimately produce integrated circuit or MEM devices.

An ICP reactor may be used to carry out a variety of processes to fabricate integrated circuit devices from a semiconductor substrate, including anisotropic and isotropic etch and chemical vapor deposition (CVD). For anisotropic etch, an ICP reactor may be used to produce a plasma with a high ion density. Generally, a low pressure and high RF power are used which favor the production of ions. The ions are accelerated perpendicularly toward the surface of the substrate by an electric field which is typically induced by an RF bias on the wafer. The ions bombard the substrate and physically and/or chemically etch the substrate and any materials deposited thereon, such as polysilicon (poly), silica ($SiO_2$, silicon oxide, or oxide), silicon nitride ($Si_3N_4$ or nitride), photoresist (resist), or metal deposited on the substrate. Such anisotropic etch processes are useful for forming integrated circuit features having substantially vertical sidewalls.

ICP reactors are also useful for producing reactive species for isotropic etching, particularly for stripping photoresist from the surface of a semiconductor substrate. Sufficient energy is coupled into the gas in the plasma generation chamber to form a plasma containing a high density of atomic and molecular free radicals that chemically react with the polymeric photoresist to facilitate its removal. For example, a plasma may be used to dissociate oxygen gas into atomic oxygen that reacts with polymeric photoresist to form CO and $CO_2$, which evolve and are carried away in the process gas in the reactor. In such processes, in contrast to anisotropic etch, it is often desirable to reduce or eliminate ion bombardment which may damage the surface of the substrate.

ICP reactors are also useful for CVD of a material onto the surface of a substrate. For many CVD processes, the process is enhanced by ion bombardment and may be carried out at lower temperatures with higher deposition rates by exposing the substrate directly to the plasma (plasma enhanced CVD). In CVD, sufficient energy is coupled into the gas in the plasma generation chamber to form a plasma containing a high density of atomic and molecular free radicals and energetic species that interact with the surface of the substrate to form a deposited layer. For example, silane ($SiH_4$) releases hydrogen and can be used to deposit a layer of polysilicon onto a substrate. In addition, silane or TEOS can be added to an oxygen plasma to deposit a layer of silicon dioxide on a substrate, which can be used as an etch mask during reactive-ion etching or as an insulating layer in circuit devices.

In each of the above processes, processing uniformity is a critical factor in determining integrated circuit quality, yield, and production rate. Uniform etching, stripping, or chemical deposition over the surface of a wafer assures that structures fabricated at the center of the wafer's surface have essentially the same dimensions as structures fabricated near the edge of the wafer. Thus the yield of chips from a wafer depends at least in part on the etch, strip, or deposition uniformity across the wafer's surface. Higher yield also contributes to a higher production rate.

Processing uniformity may be affected by the density and distribution of reactive species in the plasma and by the plasma potential across the wafer's surface. Processing may occur at higher rates in areas of the wafer surface where there is a higher density of reactive species. Further, for ion enhanced processes, any variance in the plasma potential across the wafer's surface will cause a corresponding variance in ion bombardment energies which may, for example, lead to nonuniform ion etch or ion enhanced deposition.

A number of different inductively-coupled reactor configurations have been used to produce plasmas for wafer processing. Typically, a cylindrical reactor chamber surrounded by a helical induction coil is used for plasma processing, although hemispheric reactor chambers (see U.S. Pat. Nos. 5,346,578 and 5,405,480) and reactors with planar coils in a "pancake" configuration (see U.S. Pat. Nos. 5,280,154 and 4,948,458) have been used as well. In typical conventional reactors, a plasma of acceptable uniformity can be produced provided that the diameter of the substrate and, consequently the reactor chamber, is not too large.

In an effort to increase chip production rates, however, integrated circuit manufacturers have moved from small-diameter substrates to substrates of ever-increasing diameter. At one time, 100 millimeter (mm) silicon wafers were the norm. These wafers were subsequently replaced by 150 mm and then 200 mm wafers. 300 mm wafers have been produced and will undoubtedly become the standard wafer for high-volume and high complexity computer chips in the near future. In time, it is expected that even larger wafers will be developed.

With larger diameter substrates, it becomes difficult to produce a plasma with highly uniform properties in a conventional cylindrical reactor chamber. For ion enhanced processes, the flux of ions across the wafer surface may become nonuniform. FIG. 1 illustrates a typical cylindrical ICP reactor, generally indicated at 100. In reactor 100, gas is provided to the reactor chamber 102 through an inlet 104. A helical induction coil 106 surrounds the chamber and inductively couples power into the gas in the reactor chamber to produce a plasma. Ions or neutral activated species then flow to a wafer surface 108 for processing. In addition, an RF bias may be applied to the wafer to accelerate ions toward the wafer surface for ion enhanced processing.

The dashed line 110 in FIG. 1 represents a stagnation surface for a plasma produced in the reactor of FIG. 1. The stagnation surface is the surface of maximum DC plasma potential. Ions inside the stagnation surface tend to fall to the wafer surface for processing, while ions outside the stagnation surface tend to fall to the walls of the reactor chamber. A higher percentage of ions near the edges of the wafer fall to the walls than near the center of the wafer as illustrated by the curved stagnation surface 110 in FIG. 1. This is a result of the proximity of the walls to the edges of the wafer and is also a function of the ion production rate in the reactor volume. In large diameter reactor chambers, the difference in the ion flux between the edges and the center of the wafer may be significant and lead to nonuniform processing. Even in non-ion enhanced processes, such as isotropic etch, nonuniform production of reactive species across a large diameter wafer surface may lead to nonuniform processing.

Thus, as larger diameter wafers are processed, problems are expected to be encountered with conventional inductively-coupled plasma reactor configurations. Moreover, integrated circuit features are expected to decrease in size, requiring increased processing uniformity.

What is needed is a plasma reactor with enhanced control over the plasma characteristics in the center of the chamber while allowing large diameter wafers to be processed. Preferably such a plasma reactor can be used to provides a uniform plasma potential and/or species concentration across the surface of a substrate for etching, stripping or chemical vapor-deposition and can be used to process smaller wafers such as 100 mm, 150 mm, and 200 mm wafers as well as 300 mm or larger wafers. In addition, for non-ion enhanced processes, such as photoresist strip, it is desirable to provide a reactor configuration that both enhances the uniform production of reactive species and provides a plasma generation volume that can be used to isolate the plasma from the wafer surface to reduce ion drive-in.

SUMMARY OF THE INVENTION

One aspect of the present invention provides an inductively-coupled plasma reactor with a conically-shaped chamber section for producing a plasma. An induction coil is arranged in a conical shape around at least a portion of the conically-shaped section to couple energy into the plasma. For non-ion enhanced processes, a conical reactor shape causes neutral activated species to be produced at various diameters in the reactor chamber and thereby enhances uniform diffusion of the species throughout the chamber volume and across the wafer surface. The chamber section and/or coil may also be configured in a geometry that is concave from a true cone shape such that an even larger portion of the coil is near the center of the reactor chamber.

For ion enhanced processes, a truncated conical section can be used to flatten the plasma's stagnation surface and increase the uniformity of the plasma potential across the wafer surface. The truncated conical section allows the induction coil to be positioned over the corners of the stagnation surface. This coil arrangement increases ion production over the edges of the wafer which helps counteract the decrease in the stagnation surface near the edge of the wafer due to ions colliding with the walls of the reactor chamber. In addition, by truncating the conical section, the top of the reactor is lowered which helps flatten out any peak in the stagnation surface over the center of the reactor. The top of the reactor chamber may also be slightly concave, curving toward the center of the reactor, to push the center of the stagnation surface toward the wafer and thereby further flatten its profile across the wafer surface. Thus, a plasma reactor having a conically-shaped section can be used to produce a plasma with a highly uniform potential and charged species concentration across the surface of a large diameter wafer. The uniform potential and charged species concentration allow highly uniform anisotropic etching and plasma-enhanced chemical vapor deposition to be carried out in such a reactor.

Thus, in a further embodiment of the invention, a method is provided for substantially uniform anisotropic etching, plasma-enhanced CVD, or isotropic etching across the surface of a substrate. The method comprises the steps of: providing an inductively-coupled plasma reactor with a conically-shaped chamber section for producing a plasma; supplying a gas to the chamber; inductively coupling power into the gas through the conically-shaped section; producing at least one plasma product in the chamber for processing a substrate; and exposing the substrate to the plasma product during processing. Preferably power is inductively coupled from an induction coil surrounding the chamber in a substantially conical spiral. In alternative embodiments, the chamber and/or induction coil may follow a geometric contour that is concave from a true cone to allow additional power to be coupled into a center region of the chamber. The cone angle and shape of the reactor, the pitch and power level of the induction coil, and the power frequency may be selected to produce a highly uniform plasma potential and/or concentration of plasma species across the surface of the substrate being processed. For anisotropic etching or plasma-enhanced CVD, an electric field may be induced near the substrate to accelerate ions toward the substrate surface for processing. Preferably, an RF bias is applied to a substrate support, although other direct or alternating current biases, magnets or separate inductively or capacitively coupled electrodes may be used to induce an electric field to enhance processing.

A reactor according to aspects of the present invention provides significant advantages over conventional plasma reactors. A plasma with a highly uniform potential and species distribution may be produced. In addition, the ability to form a circulating plasma in a conically-shaped plasma generation volume allows ion bombardment of the substrate and chamber walls to be reduced relative to reactors that use capacitively coupled electrodes to generate a plasma. The highly uniform plasma may be isolated in the conical volume away from the substrate surface for ion sensitive processes such as photoresist strip. For ion enhanced processes, a separate power source may be used to controllably accelerate ions toward the substrate surface for processing.

Additional advantages are realized when reactors according to aspects of the present invention are arranged side-by-side for multi-wafer processing. With conventional cylindrical chambers, the induction coil has a large diameter along the entire length of the chamber. Adjacent chambers are separated by a conductive wall to avoid interference between the coils. The chambers must also be spaced a distance from the wall to avoid arcing or the inducement of strong currents in the wall. Reactors according to aspects of the present invention, on the other hand, may be configured with an induction coil that spirals inward along a conically-shaped section. The induction coil has increasingly smaller diameter turns toward the top of the conically-shaped section and, as a result, a large portion of the coil is indented from the periphery of the reactor. The coil configuration thereby allows the chamber to be spaced closer to a conductive wall and other equipment without undue interference. Thus, reactors according to aspects of the present invention may be arranged with a reduced footprint thereby conserving expensive clean room space.

BRIEF DESCRIPTION OF THE DRAWINGS

These and other features and advantages of the present invention will become more apparent to those skilled in the art from the following detailed description in conjunction with the appended drawings in which.

DESCRIPTION

Aspects of the present invention provide a novel apparatus and method for processing semiconductor substrates. The following description is presented to enable a person skilled in the art to make and use the invention. Descriptions of specific applications are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the described or illustrated embodiments, but should be accorded the widest scope consistent with the principles and features disclosed herein.

Figure 1A:
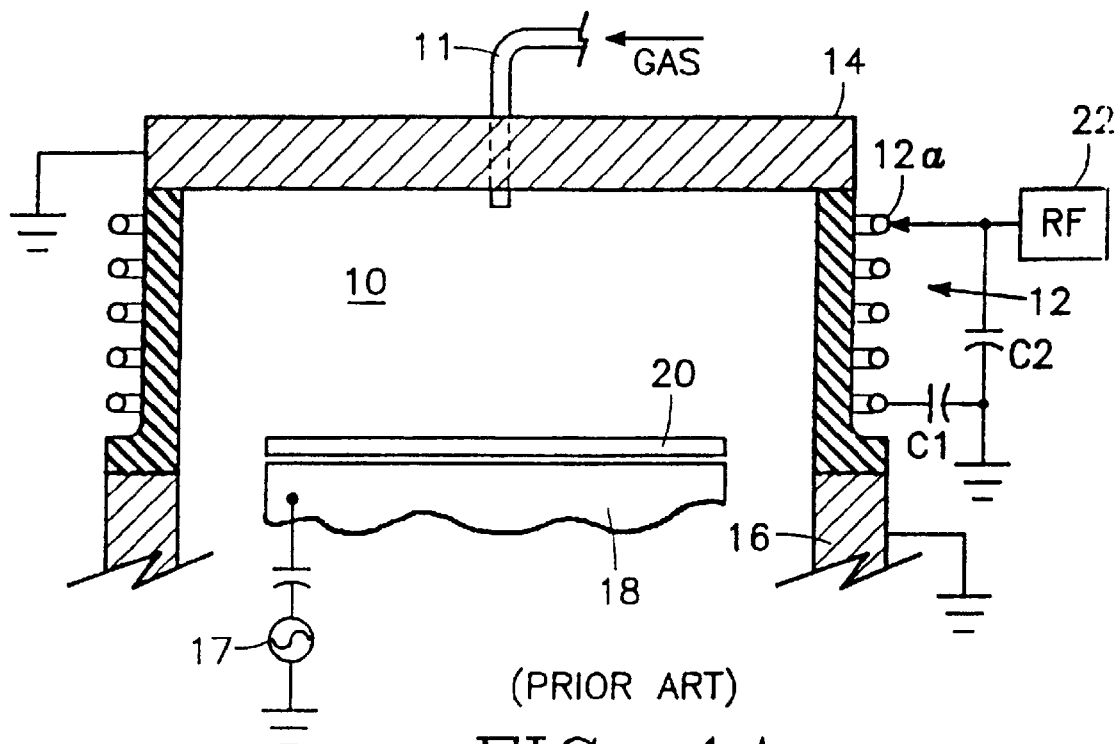
FIG. 1 is a simplified diagram illustrating the plasma properties in a conventional cylindrical ICP reactor.
Figure 1B:
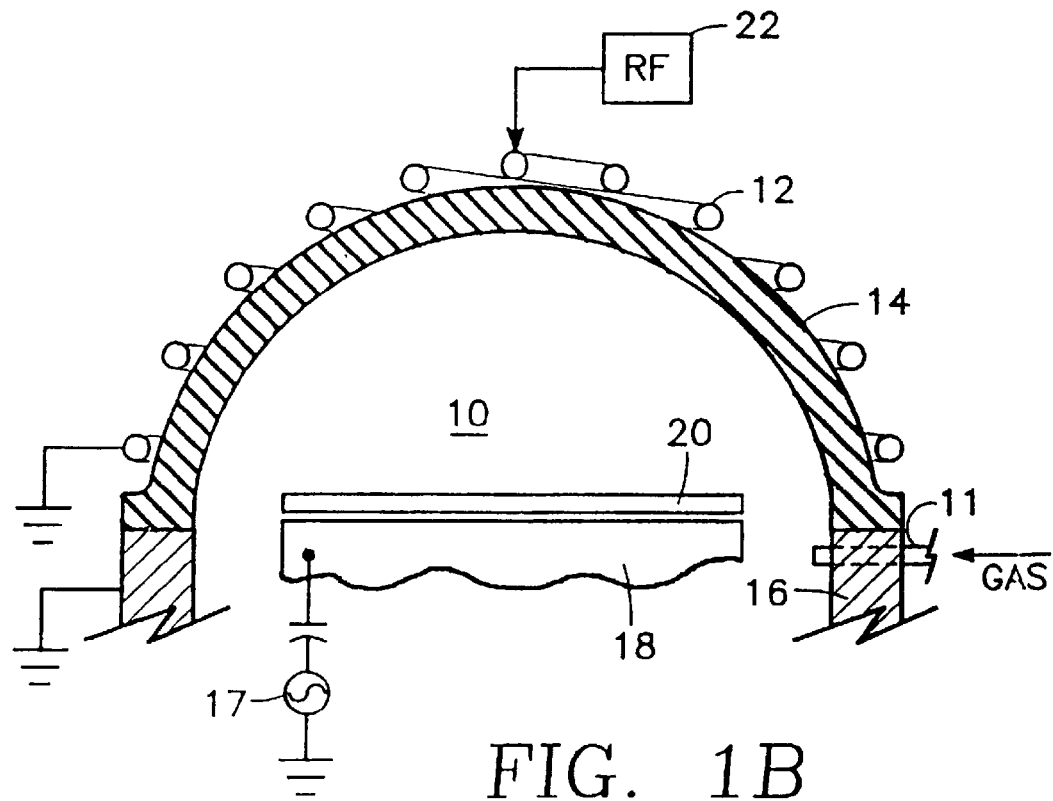
Figure 2A:
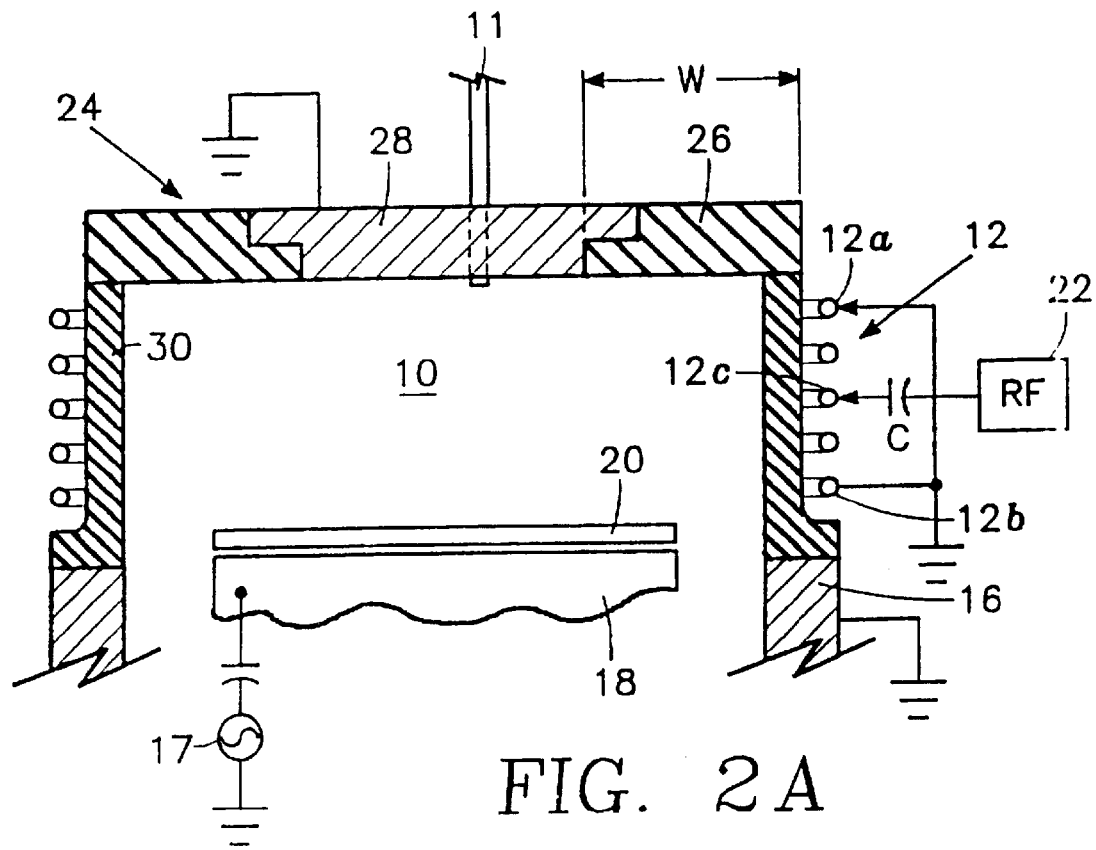
FIG. 2A shows a reactor according to a first embodiment of the present invention which is used for ion enhanced processes such as anisotropic etch and plasma-enhanced CVD.

FIG. 2A is a side cross section of an inductively coupled plasma reactor according to a first embodiment of the present invention for ion enhanced processes such as anisotropic etch and plasma enhanced CVD. Referring to FIG. 2A, the reactor, generally indicated at 200, has a plasma generation chamber 216 which has a conically-shaped section 216a and a cylindrical section 216b. The plasma generation chamber 216 has a nonconductive chamber wall 212. A helical induction coil 270 surrounds the conically-shaped section 216a and substantially conforms to its conical shape. The induction coil 270 is coupled to a first source of radio frequency power 280 to inductively couple power into the plasma generation chamber 216.

Gas is provided to the plasma generation chamber 216 through a gas inlet 224 and is exhausted from the reactor through a gas outlet 230. The inductively coupled power from induction coil 270 causes a plasma to form in chamber 216. A substrate to be processed, such as a semiconductor wafer 250, is placed on a support 244 below the plasma. The inductively coupled power accelerates electrons circumferentially within the plasma and generally does not accelerate charged particles toward wafer 250. The level of power applied to the induction coil may be adjusted to control the ion density in the plasma. Some power from the induction coil may be capacitively coupled into the plasma, however, and may accelerate ions toward the walls and the wafer. To reduce this capacitive coupling a split Faraday shield 214 may be placed around the reactor. See U.S. Pat. No. 5,534,231, which is assigned of record to the assignee of the present invention and which is hereby incorporated herein by reference.

A second source of radio frequency power 281 may be applied to the wafer support 244 to controllably accelerate ions toward the wafer for processing. A relatively high level of power may be applied to the induction coil to provide a plasma with a high ion density, and a relatively low level of power may be applied to the wafer support to control the energy of ions bombarding the wafer surface. As a result, a relatively high rate of etching may be achieved with relatively low energy ion bombardment. The use of low energy ion bombardment may be desirable in some processes to protect sensitive integrated circuit layers from damage.

The conically-shaped chamber section 216 and induction coil 270 of the first embodiment allow a plasma to be formed across the surface of wafer 250 with a highly uniform plasma potential and species concentration. The induction coil spirals around the conically-shaped chamber section 216a substantially conforming to its shape. In the first embodiment, the coil 270 completes three turns 270a–c along the length of chamber 216. The upper section 270a has the smallest diameter and provides the highest power density along the central longitudinal axis of the conical chamber 216. Subsequent turns of the coil have increasing diameters and provide a lower power density along the central longitudinal axis of the conical chamber 216. These subsequent turns produce a plasma near the periphery of the chamber while sustaining a plasma with consistent properties in the center of the chamber.

For processing a twelve inch wafer, the first turn 270a may have a diameter from the center of the coil on one side of the chamber to the center of the coil on the other side of the chamber in the range of from about ten to fourteen inches. The second turn 270b may have a diameter in the range of from about twelve to sixteen inches; and the third turn 270c may have a diameter in the range of from about fourteen to eighteen inches. In a conventional cylindrical reactor, on the other hand, each turn of the coil would typically have the same diameter.

Figure 2B:
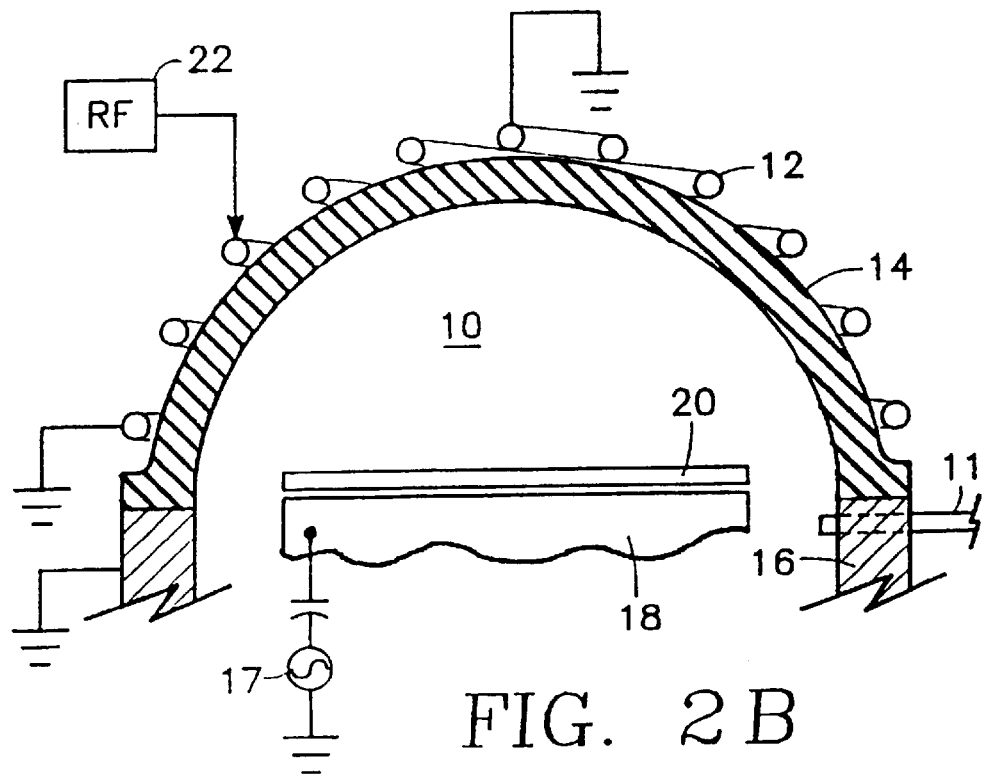
FIG. 2B is a simplified diagram illustrating the plasma properties in the reactor of FIG. 2A.
Figure 1C:
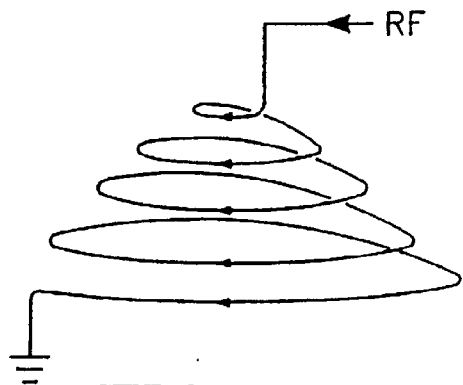

FIG. 2B is a simplified diagram illustrating the plasma properties in reactor 200. The dashed line 280 in FIG. 2B represents a stagnation surface for a plasma produced in reactor 200. As shown in FIG. 2B, the induction coil 270 is positioned along the conically-shaped section over the corners of the stagnation surface and the edges of the wafer. This configuration produces hot regions in the chamber indicated at 285, with a high rate of ionization at the corners of the stagnation surface. The increased rate of ionization in these regions helps counteract the natural tendency of the stagnation surface to gradually drop off near the side walls of the reactor. This results in a flatter stagnation surface across the wafer surface which produces more uniform ion bombardment of the wafer. In addition, the truncated conical arrangement of the coil allows the top of the chamber 288 to be lowered which helps flatten out any peak in the stagnation surface over the center of the wafer. The top of the reactor chamber may also be slightly concave, curving toward the center of the reactor, to push the center of the stagnation surface toward the wafer and thereby further flatten its profile across the wafer surface.

As a result, the reactor according to the first embodiment produces a plasma with a highly uniform potential and ion concentration across both the center and periphery of the wafer surface. An RF bias applied to wafer support therefore accelerates ions toward the wafer surface for etching or plasma enhanced CVD with substantially uniform energy and density. This results in a consistent etch or deposition rate across the wafer surface.

The structure and operation of the reactor 200 for anisotropic etching will now be described in detail with reference to FIG. 2A. In the first embodiment, a semiconductor substrate such as a twelve inch or larger wafer 250 is placed in a processing chamber 240 for etching. The processing chamber 240 has a height, $h_1$, of approximately 25 cm and a width of approximately 45–50 cm. The conically-shaped chamber section 216a is positioned above the processing chamber.

The processing chamber wall 242 is grounded. The processing chamber wall 242 provides a common ground for the system and comprises a conductive material such as aluminum or the like. Within the processing chamber is a wafer support 244 that also acts as an electrode for accelerating ions toward the electrode. This electrode may also be made in part of aluminum. The electrode is supported by a ceramic support 246.

As shown in FIG. 2A, below ceramic support 246 is a gas outlet 230. Gas may be exhausted from the reactor through outlet 230 using a conventional fan, pump or similar device. The gas outlet 230 is coupled to a throttle valve 234 for regulating the gas flow in the exhaust system. A shut off valve 232 is also provided.

The top surface of processing chamber 240 is approximately 3–5 cm above the surface of wafer 250. The plasma generation chamber 216 is positioned over the top surface of processing chamber 240 and forms a circular opening over the wafer surface with a diameter, $d_1$, of approximately 40–45 cm. The opening over the wafer is sufficiently large to produce a plasma across the entire wafer surface. The conically-shaped section 216a is truncated at a diameter, $d_2$, of approximately 27–30 cm. Preferably the ratio of $d_2$ to $d_1$, is from approximately 0.5 to 0.7. The cylindrical chamber section has a height, h2, of approximately 9–11 cm and the conically-shaped section has a height, h3, of approximately 3.5–4.5 cm. Preferably the ratio of h3 to h1 is from approximately ¼ to ⅓. The cone angle for the conically-shaped section is approximately 120 degrees. That is, the conically-shaped section slopes downward from the top of the chamber 288 at an angle of approximately 30°. The length, L, of the conically-shaped section (indicated in FIG. 2B) is approximately 7–8 cm and the middle turn of the coil 270b is approximately 2.5–3.5 cm (i.e., 20–30% of the total length) from the bottom of the conically-shaped section. The plasma generation chamber wall 212 is made of a nonconductive material such as quartz or alumina and has a thickness of approximately 4 to 6 millimeters.

A gas supply system (not shown) provides gases (such as oxygen, $SF_6$, $CHFCl_2$, argon or the like) to the plasma generation chamber through gas inlet 224. The gas supply system and the gas exhaust system cooperate to maintain a gas flow and pressure in the generation chambers that promotes ionization given the strength of the induction electric field. For an $SF_6$/Ar gas based process (i.e., silicon etch), pressures in the range of 5–20 millitorr are used, with 7–10 millitorr being preferred. In the first embodiment, $SF_6$ gas is provided to the generation chamber at between approximately 10 to 50 standard cubic centimeters per minute, with 30 standard cubic centimeters per minute being typical. In addition, about 100 to 200 standard cubic centimeters of argon are provided to the generation chamber. The pressure in the chamber is maintained at less than about 30 millitorr with a pressure in the range of about 7–10 millitorr being typical. It is believed, however, that total flow rates from 50 standard cubic centimeters per minute up to 300 standard cubic centimeters per minute may be used effectively in this embodiment.

The induction coil 270 is connected to a first power source 280 through a conventional impedance match network (not shown). In the present embodiment, the induction coil has three turns 270a–c spiraling in a conical shape around plasma generation chamber 216, although any number of turns from two to ten or more may be used depending upon the level of power to be coupled into the reactor. The induction coil 270 has a conductor diameter of approximately ¼ inch, and each turn is separated from an adjacent turn by a distance of about ⅜ to ⅝ of an inch from center to center. The pitch of the coil is determined by the number of turns of the coil along a given length of the plasma generation chamber. In the first embodiment, with three turns each separated by about ⅝ of an inch from an adjacent coil, the pitch is approximately two turns per inch.

The pitch of the coil may be varied in different reactors to alter the power density coupled into the reactor. The pitch of the coils may range, for example, from ½ to 10 turns per inch and may vary along the plasma generation chamber to alter the level of power coupled into the plasma at a particular point. It is also possible to vary the power level along the plasma generation chamber by using multiple coils coupled to different power sources each surrounding a different portion of the conically-shaped plasma generation chamber. What is desired is a coil configuration with a pitch, diameter and power level that provides a highly uniform plasma potential across the wafer surface.

In the first embodiment, the first power source provides RF power to the induction coil at a frequency of approximately 13.56 MHz although it is believed that frequencies from 2 kHz to 40.68 MHz can be used effectively in reactor 200. The power level is typically selected to provide a power density throughout the plasma in the range of from about 0.5 to 3 watts/cm$^3$ with a power density of about 1 watt/cm$^3$ being preferred. An RF bias in the same frequency ranges may also be applied to wafer support 244 to accelerate ions anisotropically toward the wafer surface. Typically, a low power level of about 100 to 500 watts is applied to support 244 to limit the ion bombardment energy and avoid damage to sensitive integrated circuit layers.

Figure 2C:
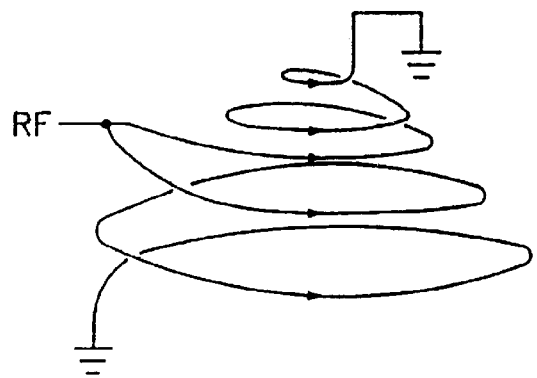
FIG. 2C illustrates an exemplary split Faraday shield that may be used with the reactor of FIG. 2A.
Figure 2D:
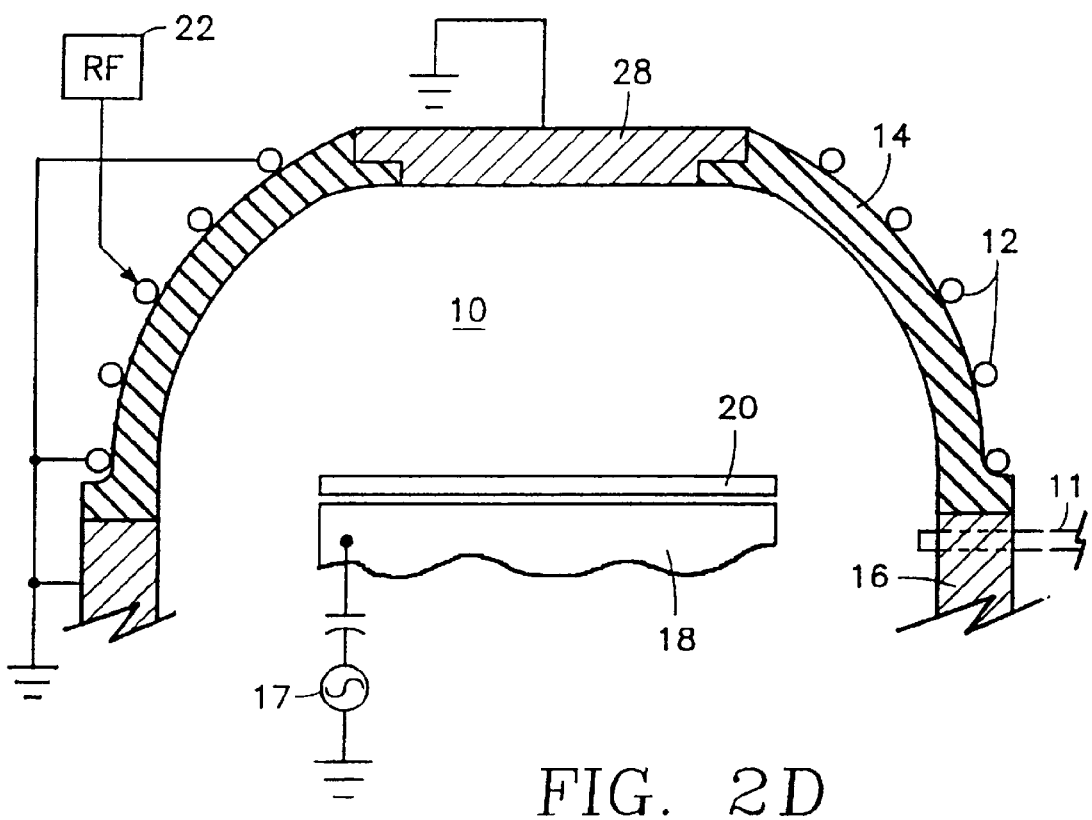

In some embodiments, particularly when a high frequency power source is applied to the induction coil, the induction coil may capacitively couple power into the plasma and modulate the plasma potential relative to the wafer surface. See U.S. Pat. No. 5,534,231 and U.S. patent application Ser. No. 08/340,696, each of which is incorporated herein by reference. At power levels used to produce a dense plasma, the plasma modulation may cause higher energy ion bombardment and degrade the process or damage some exposed layers on the wafer. As shown in FIG. 2A, a split Faraday shield 214 may be interposed between the induction coil 270 and the plasma to reduce capacitive coupling between the coil and the plasma. FIG. 2C illustrates the structure of a split Faraday shield 214 that is used in the first embodiment when high frequency power is applied to the induction coil. The shield is conically shaped similar to the plasma generation chamber. The bottom of the split Faraday shield is connected to the top of the processing chamber wall 242 in multiple locations to provide a common RF ground for all of the sections of the split Faraday shield. The split Faraday shield has vertical slots 290 that allow the induction electric field from the induction coil to penetrate into plasma generation chamber. The slots prevent a circumferential current from forming in the shield which would oppose the induction electric field. The induction electric field therefore penetrates the shield and accelerates electrons circumferentially in the chamber to produce a plasma. However, the shield substantially reduces capacitive coupling from the induction coil which would otherwise accelerate charged particles radially toward the wafer and chamber walls.

In some processes charge buildup on wafer surfaces can deflect low energy ions and interfere with a low energy anisotropic etch as described in U.S. provisional patent application Ser. No. 60/005,288, filed as utility application Ser. No. 08/727,209 on Oct. 13, 1995, assigned to the assignee of the present application and hereby incorporated herein by reference in its entirety. For such processes, problems associated with charge buildup can be avoided by using high and low power cycles on the induction coil 270 and the wafer support 244 as described in U.S. provisional patent application Ser. No. 60/005,288 filed as utility application Ser. No. 08/727,209 on Oct. 13, 1995. In an exemplary configuration, the first power source applies RF power to the induction coil 270 during high power cycles and applies no power during low power cycles. RF power at 13.56 MHz is typically used, although other frequencies may be used as well. The high power cycles typically last anywhere from 5 to 100 microseconds and the low power cycles typically last from 30 to 1000 microseconds. The duration of the high power cycles is typically less than or equal to the duration of the low power cycles. The duty cycle of the high power cycles is typically greater than or equal to 10%. The above configuration is exemplary. What is desired is a high power cycle that sustains a plasma discharge with sufficient ion density for the desired etch rate, and a low power cycle that allows electrons to cool without reducing the ion density below the level required for etching and without making it difficult to sustain the plasma discharge with the next high power cycle.

In the exemplary configuration, the second power source applies a strong negative voltage pulse to the wafer support during high power cycles and applies little or no voltage during low power cycles. During the high power cycles, the second power source applies a negative bias of from 20 to 500 volts on the wafer support. A single square, triangular or sinusoidal pulse may be used to provide the bias during each high power cycle. The duration and frequency of the pulses are typically selected such that several pulses occur during the average transit time for an ion to cross the plasma sheath and reach the substrate surface. These pulses cause the substrate to be etched by ions which are mainly "coasting" to the surface. The duration of the pulses typically range from 1% to 10% of the average ion transit time with typical values in the range of from about 0.02 to 0.2 microseconds. The frequency of the pulses typically ranges from 500 kHz to 60 MHz. The above configuration is exemplary. What is desired is an intermittent bias on the substrate that alternates between ion acceleration cycles that accelerate ions toward the substrate for anisotropic etching and charge neutralization cycles that neutralize or remove charges that have accumulated on the substrate surface.

In an alternate embodiment, a lower frequency A.C. bias (100 kHz to 1 MHz) is applied to the substrate. The bias may be a continuous A.C. wave or it may alternate between high power cycles (for multiple wavelengths) and low (or zero) power cycles. Preferably, the half cycles of the A.C. waveform are at least equal to the ion transit time for ions in the sheath region. When a low frequency A.C. bias is used, negative and positive ions are alternatively accelerated toward the substrate for etching. Since the etch alternates between negative and positive ions, charge buildup on the substrate surface is avoided. See U.S. provisional application Ser. No. 60/005,288, filed as utility application Ser. No. 08/727,209 on Oct. 13, 1995 which is incorporated herein by reference, for additional information regarding power signals that may be applied to the induction coil and wafer support to reduce problems associated with charge buildup on a substrate surface. The techniques described therein may be combined with a conically-shaped chamber section and induction coil according to the present invention to reduce charge buildup while providing more uniform plasma etching across a large diameter wafer surface.

Techniques similar to those described above may also be used to produce abundant dissociated radicals for resist removal or the like. Whereas the above described reactor is configured to promote the production of ions for anisotropic etching, a reactor for resist removal is preferably configured to promote dissociation and minimize ionization. Thus, according to a second embodiment of the present invention, a plasma reactor with a conically-shaped plasma generation chamber is provided for the efficient dissociation of molecules for use in resist removal or similar processes.

At a general level, the structure of a reactor for dissociation according to the second embodiment is similar to the reactor for anisotropic etching according to the first embodiment as described above. Induction coils surround a conically-shaped plasma generation chamber and inductively couple energy into the chamber to produce a plasma. Electrons are accelerated circumferentially within the plasma by the induction electric field causing collisions with molecules. These collisions result in excited molecules, dissociated atoms, and ions. Higher energy collisions tend to produce ionization, while lower energy collisions result in excitation and dissociation. In particular, electron energies in the range of 11–12 eV are typical for the threshold for ionization of oxygen gas, while electron energies of 5–6 eV are typical for the threshold for dissociation.

The electron energies depend upon the strength of the electric field which accelerates the electrons and the density of the gas which determines the mean distance over which electrons are accelerated between collisions. For an anisotropic ion etch reactor, a higher power is applied to the induction coil to increase the induction electric field, and a lower gas pressure is used which allows electrons to accelerate with fewer collisions and attain the energies necessary for ionization. For a plasma reactor used for dissociation, a lower power and higher pressure and flow are used.

In the first embodiment, a low pressure is used (1–30 millitorr) with a relatively high level of RF power applied to the induction coil (up to 10 kW). This provides a relatively high level of ionization. For the second embodiment, a higher pressure (approximately 1–2 torr) and lower level of RF power (approximately 500–1500 watts) are used. This favors dissociation over ionization relative to the first embodiment. Preferably, in the second embodiment, only enough ionization occurs to sustain the plasma and continue the dissociation of atoms.

Figure 3:
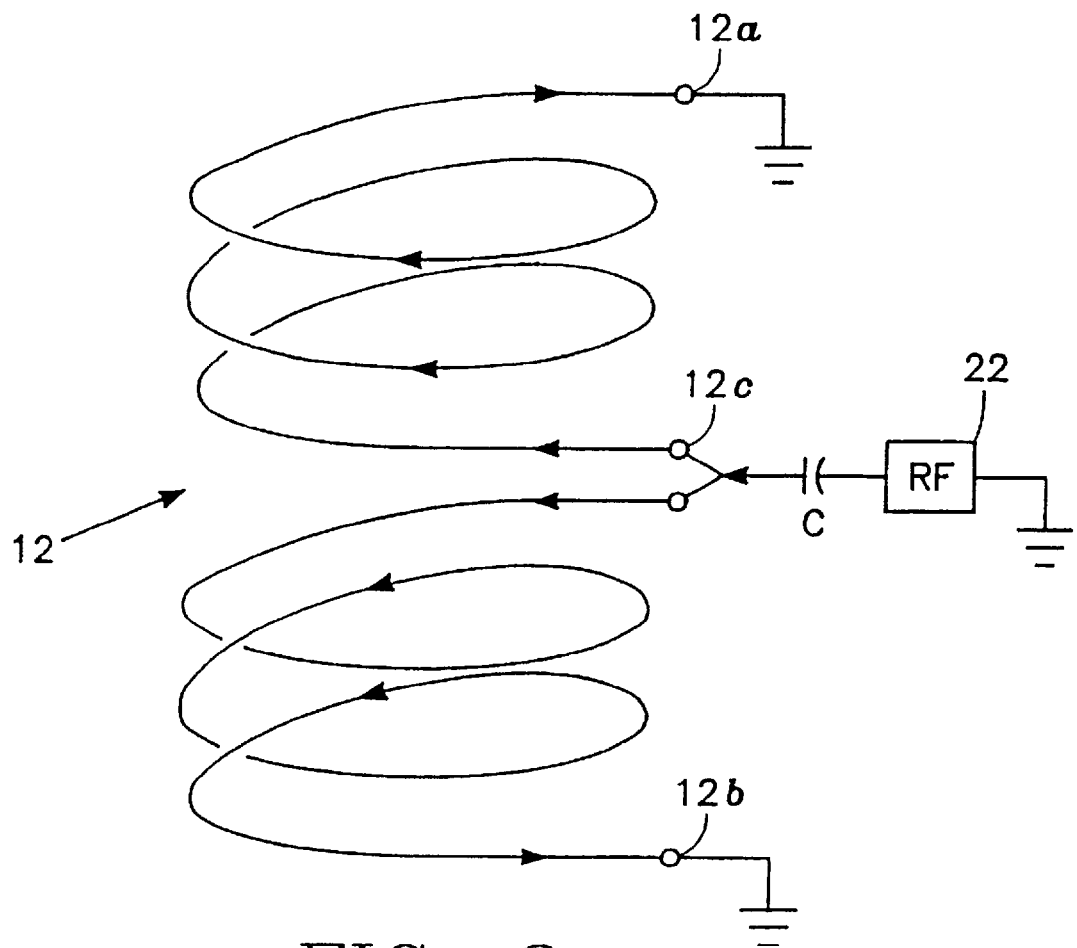
FIG. 3 is a side cross-sectional view of a dual plasma reactor system according to a second embodiment of the present invention which is used for ion sensitive processes such as photoresist strip.
Figure 4:
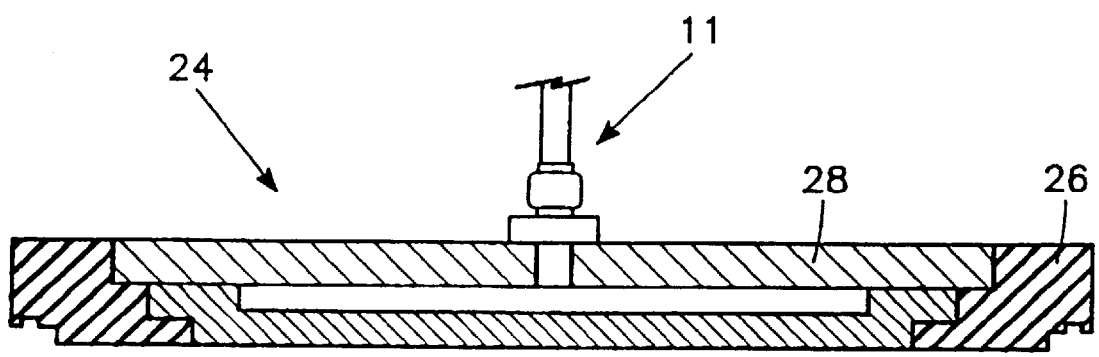
FIGS. 4A–4C illustrate an exemplary charged particle filter that may be used with the reactor of FIG. 3.

FIG. 3 is a side cross section of an inductively coupled plasma reactor according to a second embodiment of the present invention for ion sensitive processes such as photoresist strip. The reactor, generally indicated at 300, uses two plasma generation chambers 316a and 316b with conically-shaped sections side by side. Similar components are used in each of the plasma generation chambers 316a and 316b. These components are identified using the same reference numeral for each chamber, except that suffixes "a" and "b" have been added to differentiate between components for generation chamber 316a and 316b respectively. The elements of this embodiment may also be referred to generally by their reference numeral without any appended suffix. As shown in FIG. 3, the two generation chambers use substantially duplicate elements and operate substantially independently. They do, however, share a gas supply system 322, an exhaust system (330,332,334), and a substrate processing chamber 340. The reactor 300 allows concurrent processing of two wafers which doubles throughput. In particular, the reactor 300 is configured for use in conjunction with the Aspen™ wafer handling system from Mattson Technology, Inc. Of course, it will be readily apparent that aspects of the present invention may be used in any variety of plasma processing systems including systems with single or multiple plasma generation chambers. It will also be readily apparent that an anisotropic etch reactor similar to that of the first embodiment may also be fabricated using multiple plasma generation chambers.

Referring to FIG. 3, reactor 300 has plasma generation chambers 316a and b with conically-shaped sections for producing a plasma. The conically-shaped sections have nonconductive chamber walls 312a and b and are surrounded by helical induction coils 370a and b which substantially conform to the conical shape of the chamber walls. The induction coils 370a and b are coupled to first sources of radio frequency power 380a and b to inductively couple power into the plasma generation chambers 316. The conically shaped section of the plasma generation chambers 316a and b and the conically arranged induction coils 370a and b allow neutral activated species to be produced at various diameters as gas flows along the conical section. This promotes the uniform diffusion of activated neutral species across the wafer surface. It will be noted, however, that due in part to the conical peak of the chamber, the stagnation surface will not have a flat profile as in the first embodiment. Rather, the conical coil arrangement is used to enhance the production of neutral activated species throughout the chamber volume at various diameters rather than to provide uniform ion bombardment across the wafer surface. If fact, in the second embodiment, it is desirable to isolate the charged species in the plasma from the wafer surface and to expose the wafer surface only to activated neutral species for processing.

Gas is provided to the plasma generation chambers 316a and b through gas inlets 324a and b and is exhausted from the reactor through a gas outlet 330. For stripping photoresist, $O_2$ gas is provided at a rate between approximately 1 and 20 standard liters per minute through gas inlets 324, with 4 standard liters per minute being typical (2 standard liters per minute for each plasma generation chamber). The gas supply system and gas exhaust system cooperate to maintain a flow from plasma to wafer and a pressure in the reactor chamber that promotes dissociation of molecules at the selected strength of the induction electric field. For oxygen gas based processes, pressures in the range of 1–5 torr are used, with 1.5 torr being preferred. However, pressures as low as 0.1 torr or lower may be used even though ion density in the plasma increases, especially when a split Faraday shield and/or a charged particle filter (described further below) are used in conjunction with such a reactor. Typically, oxygen will be used to ash to endpoint (which is determined by the absence of CO emission). Then oxygen is used to over ash for a period approximately equal to 100% of the period required to ash to endpoint. Subsequently, an additive, such as $CF_4$, is added to the oxygen in a concentration of about 0.2% to 10% for about 15 seconds in order to remove residual contaminants.

The inductively ccqupled power from induction coil 370a and b causes plasmas to form in chambers 316a and b. The inductively coupled power accelerates electrons circumferentially within the plasmas and generally does not accelerate charged particles toward wafers 350a and b. The level of power is preferably adjusted to provide efficient production of activated neutral species with minimal ionization. In the second embodiment, the first power sources provide RF power to the induction coils at a frequency of approximately 13.56 MHz although it is believed that frequencies from 2 kHz to 40.68 MHz can be used effectively in reactor 300. A power level of from about 500 to 1,500 watts is typically used. For some processes, the power may be pulsed to provide a lower power plasma or to alter the type and concentration of species produced in the plasma.

Some power from the induction coil may be capacitively coupled into the plasma and may accelerate ions toward the walls and wafer surfaces. In the second embodiment, it is desirable to reduce capacitive coupling of power to the plasmas and thereby reduce modulation of the plasma potentials relative to wafers 350a and b. Preferably, the plasmas and wafers are maintained at near the same potentials to reduce ion bombardment of the wafers. To reduce, capacitive coupling and plasma potential modulation, split Faraday shields 314a and b may be placed around chambers 316a and b as described above with reference to FIG. 2C. See also U.S. Pat. No. 5,534,231 and U.S. application Ser. No. 08/340,696 each of which is hereby incorporated herein by reference in its entirety.

A substrate to be processed, such as semiconductor wafers 350a and b, are placed on a support 344 in a processing chamber 340 below the plasma generation chambers. The processing chamber 340 is rectangular and has a height, $h_1$, of approximately 25 cm, and a width of approximately 90–100 cm for processing twelve inch wafers. The depth of the wafer processing chamber measured from the outside of wafer processing chamber wall 342 is approximately 45–50 cm. Plasma generation chambers 316a and b are situated above the wafer processing chamber and have a diameter of approximately 40–45 cm. The plasma generation chambers are separated by a distance of approximately 45–50 cm from center-to-center in the dual reactor system. The processing chambers may be placed closer together than in conventional cylindrical reactors, because the induction coils 370a and 370b are spaced farther apart by virtue of their conical configuration. A metal wall 360 separates the plasma generation chambers to shield the induction coils from one another. The metal wall 360 and split Faraday shields 314a and b are connected to the top of the wafer processing chamber wall 342. Wafer processing chamber wall 342 provides a common ground for the system, and comprises a conductive material such as aluminum or the like.

In the second embodiment, a bias is not applied to support 344 to accelerate ions toward wafers 350. Rather, the potential of support 344 is maintained near the same potential as the volume of the chamber directly above wafers 350. This helps minimize the electric field between the plasmas and the wafers to reduce the charged particle current driven to the wafers. In the second embodiment, the support 344 comprises an aluminum block supported by a cylindrical ceramic support 346 which isolates the support from ground. In addition, an impedance element $Z_b$ may be placed between the aluminum block and a ground potential to produce a high impedance of the block to ground at the frequency of excitation, as described in copending application Ser. No. 08/340,696 incorporated herein by reference. As a result, the support 344 is substantially free to float at the chamber potential.

The support 344 also acts as a conductive heater and is maintained at a temperature that is favorable to the desired reactions at the wafer surface. The support 344 is maintained at about 250° C. for most photoresist stripping. Other temperatures may be used for other processes. For instance, a temperature of between 150° C. and 180° C. may be used for implant photoresist removal, and a temperature of approximately 100° C. may be used for descum.

The above reactor configuration produces abundant activated neutral species for stripping with a low ion current driven to the wafer. A charged particle filter 390a and b can be placed between the plasma generation chambers 316 and the wafer processing chamber 340 to reduce the ion current reaching wafers 350a and b and to block UV radiation that may be generated in the plasma from reaching wafers 350a and b. See U.S. patent application Ser. No. 08/340,696, which is incorporated herein by reference. The charged particle filter 390 used in the second embodiment is shown in additional detail in FIGS. 4A–C. The charged particle filter includes an upper grid 402 and a lower grid 404 made out of a conductive material such as aluminum. Aluminum is preferred, since the oxide that forms on its surface is both resistant to attack by fluorine atoms and does not catalyze recombination of oxygen atoms into oxygen molecules as other metals such as copper would. The grids are preferably separated by approximately 1 mm distance and are approximately 0.4 cm thick. The grids are held apart by a block of insulating material 406 such as quartz, alumina, or mica. Each grid has an array of holes. The holes are approximately 4 mm in diameter and are separated by a distance of approximately 7 mm from center to center. The array of holes 410 in the lower grid 404 may be offset from the array of holes 408 in the upper grid 402. Use of a plurality of equidistant holes maintains the substantially uniform distribution of activated neutral species produced by the conically-shaped section of the plasma generation chambers which enhances processing uniformity. In addition, use of a split Faraday shield allows use of a grid having closely spaced holes with small diameters near the plasma without causing hollow cathode discharge in the holes.

Figure 4A:
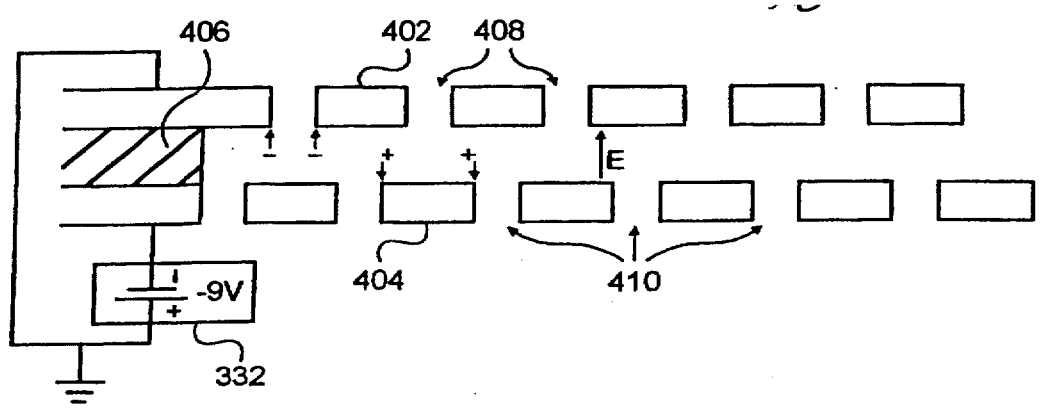
Figure 4B:
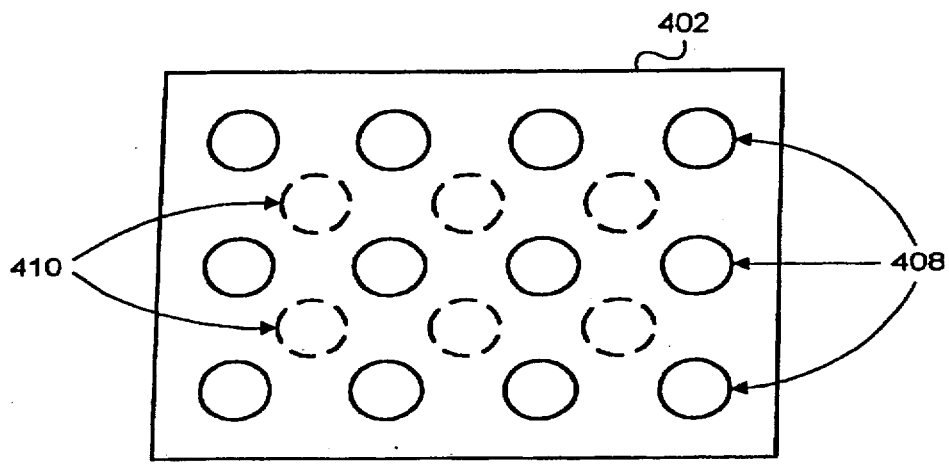

FIG. 4B is a top plan view of upper grid 402 showing the arrangement of the array of holes 408. The arrangement of the array of holes 410 relative to the array of holes 408 is indicated with dashed lines in FIG. 4B. For photoresist ashing, there is preferably no direct line of sight through the upper and lower grids 402 and 404, thereby preventing potentially damaging UV radiation in the plasma generation chambers from reaching the wafers 350. In addition, staggered grids force charged particles and dissociated atoms to follow a non-linear path through the filter, providing additional time for the neutral activated species to diffuse uniformly and providing time for charged particles to be filtered from the gas flow.

Charged particles are filtered from the gas flow through collisions with the grids 402 and 404 and/or electrical or magnetic attraction to the grid that is caused by inducing an electric field between the upper and lower grids 402 and 404. The upper grid 402 may be electrically connected to the wall 342 of the wafer processing chamber 340 and thereby grounded. The lower grid 404 is connected to a direct current power source 332 (such as a battery or the like) which places a potential on the lower grid relative to ground. Although two power sources 332a and 332b are shown in FIG. 3, it will be readily understood that a single power source may be used for both charged particle filters 390a and 390b. In the second embodiment, the potential applied to the lower grid 404 is approximately −9 volts, although it will be readily understood by those of ordinary skill in the art that other potentials may be used. Alternatively, for instance, a positive potential could be used. The purpose of applying different potentials to the upper and lower grids is to induce an electric field across the gap between the two grids which enhances the filtration of charged particles. Of course, it will be understood that the potential difference between grids should be limited so as not to induce ionization between the grids. Other methods of inducing charged particle collection may be used (such as by using a magnetic field to direct drifting charged particles in the flowing gas toward conducting vanes or plates where they are collected).

Figure 4C:
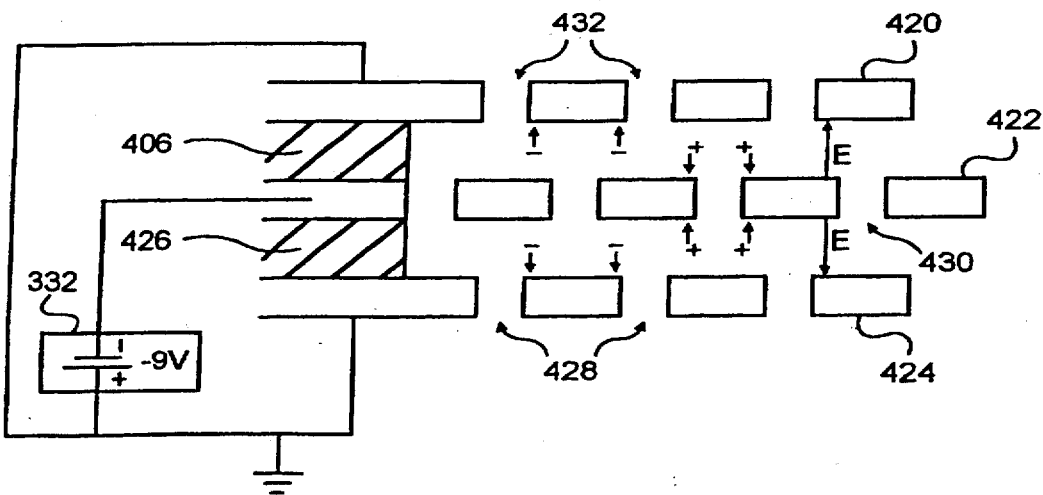
Figure 5:
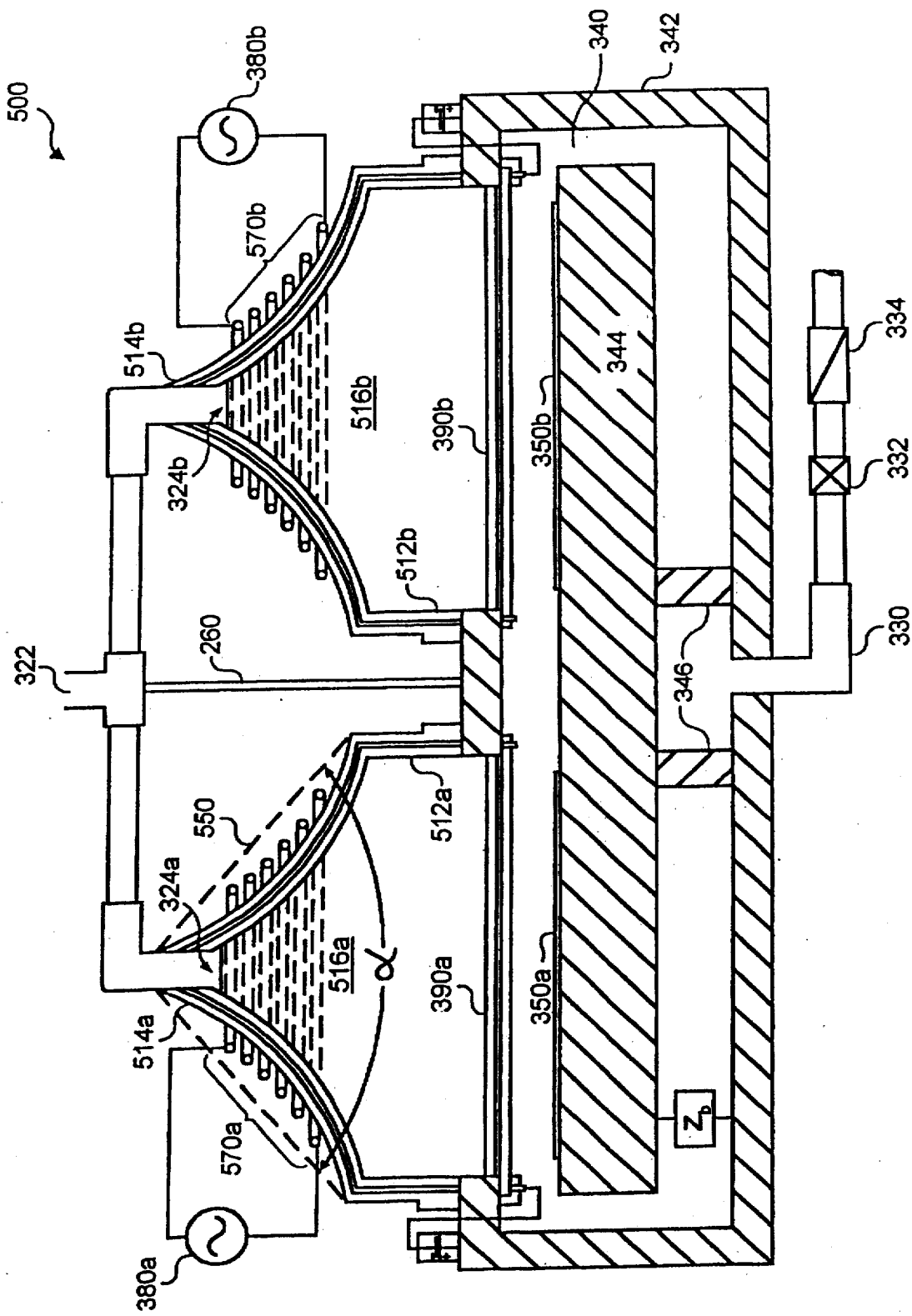

An alternative charged particle filter is shown in FIG. 4C. The charged particle filter of FIG. 4C includes an additional grid to enhance charged particle filtration. The first grid 420 and third grid 424 are grounded and each contain an array of holes (432 and 428) offset from an array of holes 430 in a middle grid 422. The grids are separated by blocks of insulating material 406 and 426. The middle grid is maintained at a potential of approximately −9 volts. In the charged particle filter of FIG. 4C, charged particles are filtered as they pass through the gaps between the first and second grids and the second and third grids. This filtration is enhanced by electric fields induced across these gaps.

The charged particle filters described with reference to FIGS. 4A, 4B, and 4C greatly reduce the concentration of charged particles that reach wafers 350. With no filter, it is estimated that approximately 0.1 $\mu A/cm^2$ of charged particle current will reach wafers 350. With a single grid at ground potential, it is estimated that approximately 10 $nA/cm^2$ of charged particle current will reach wafers 350. With two grids having a 9 volt potential difference, less than 0.1 $nA/cm^2$ (potentially as little as 1 $pA/cm^2$) of charged particle current is expected to reach wafers 350. Adding a third grid having a 9 volt potential difference relative to the second grid, is expected to reduce the charged particle current to less than 1 $pA/cm^2$.

Figure 5:
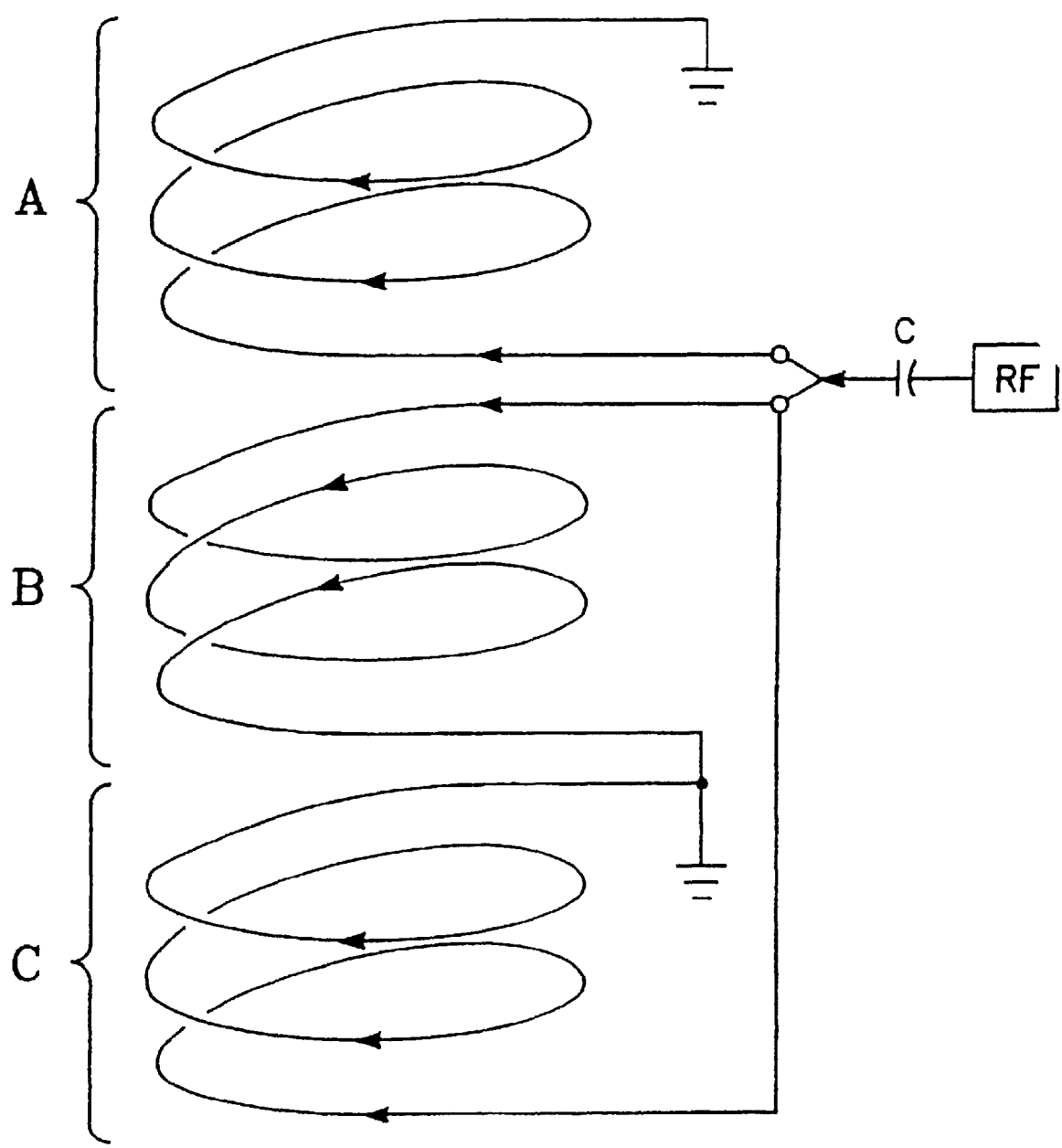
FIG. 5 illustrates an alternative conically-shaped section for a reactor according to the present invention.
Figure 6A:
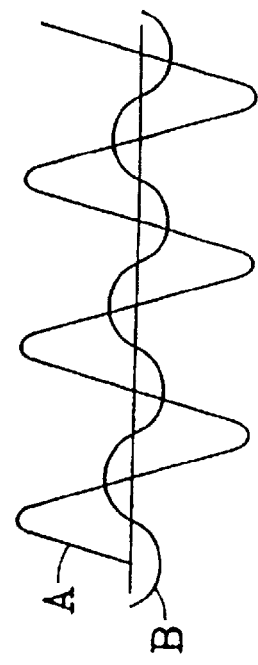
Figure 6B:
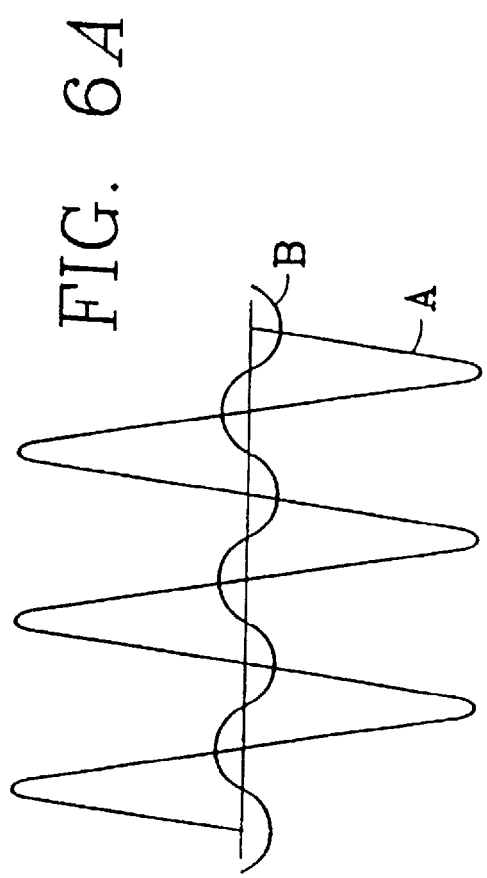
Figure 7A:
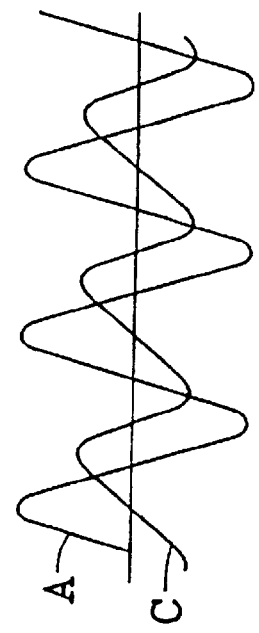
Figure 7B:
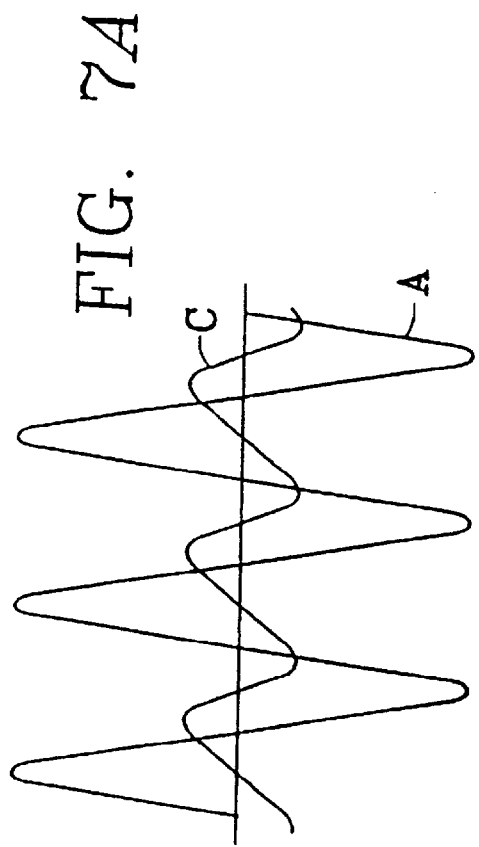
Figure 8:
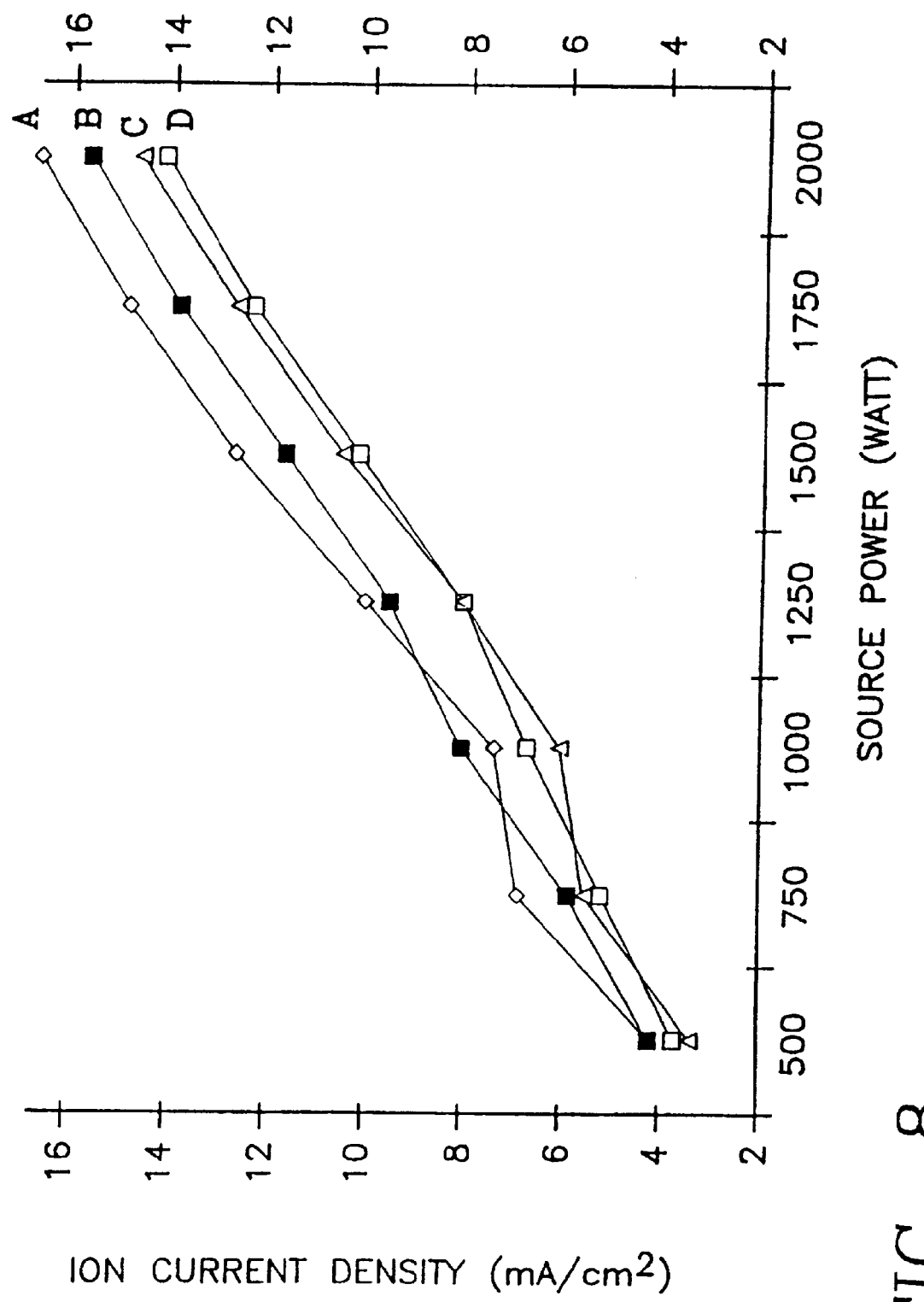
Figure 9:
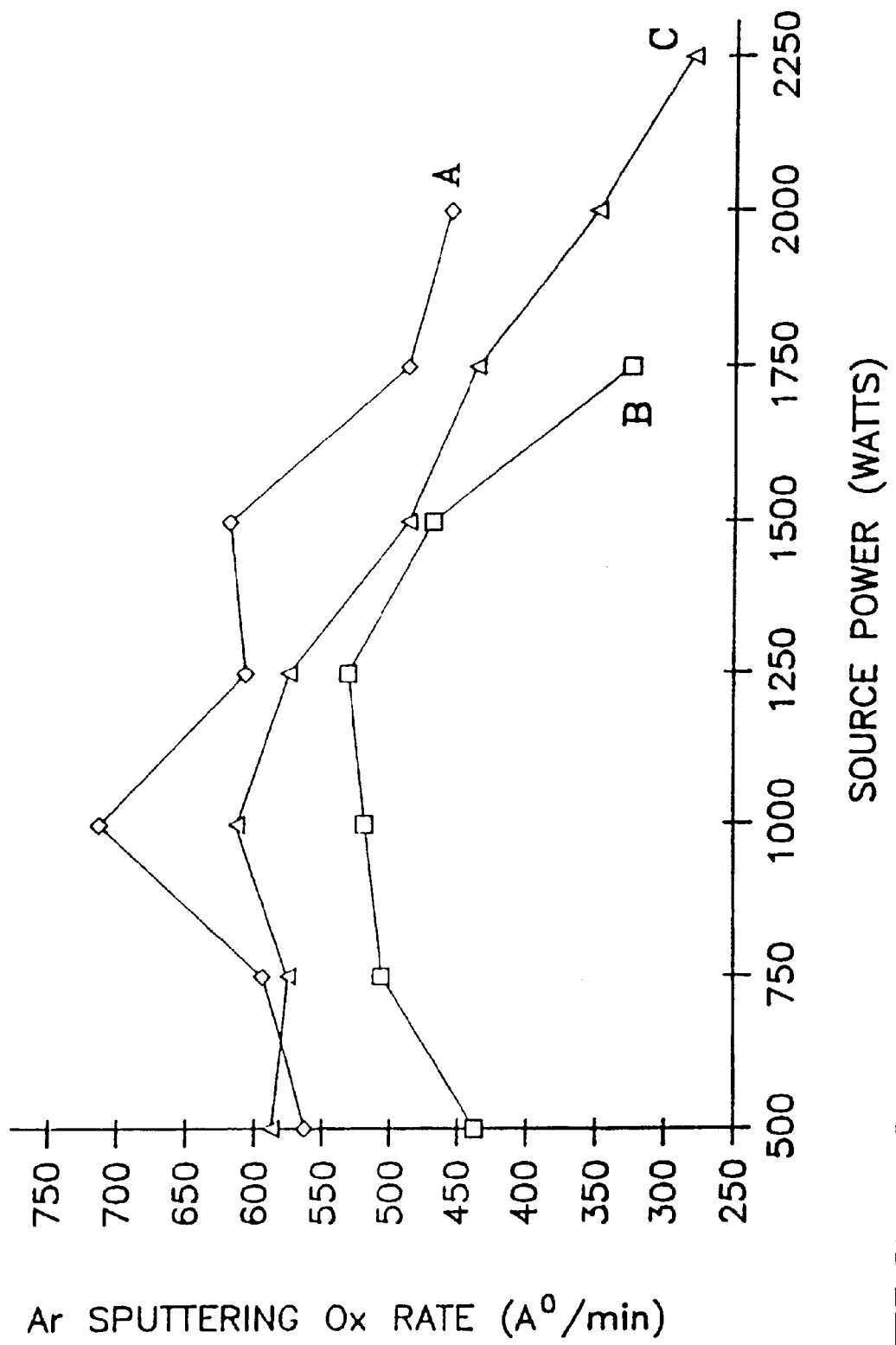
Figure 1:
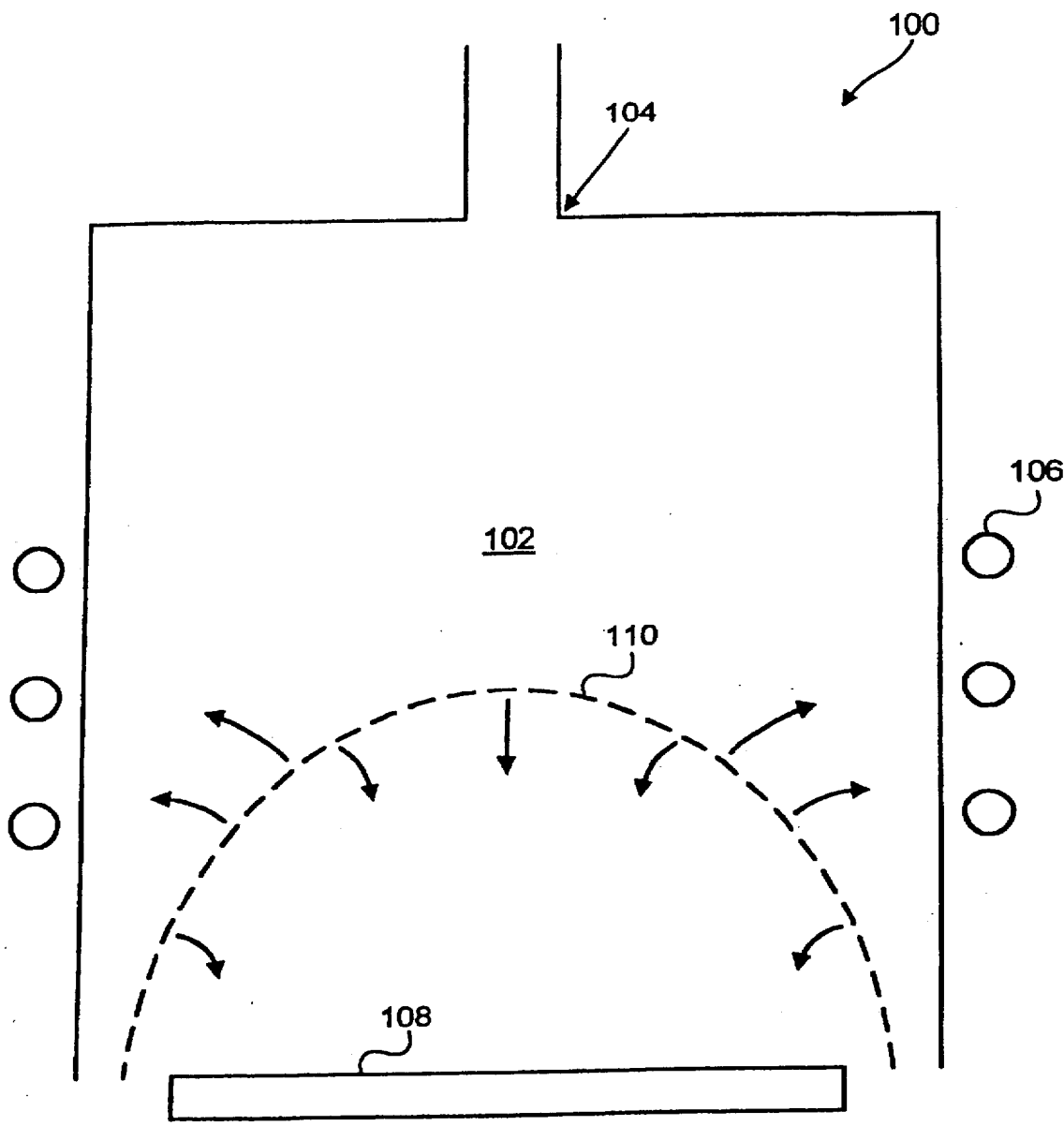
Figure 2A:
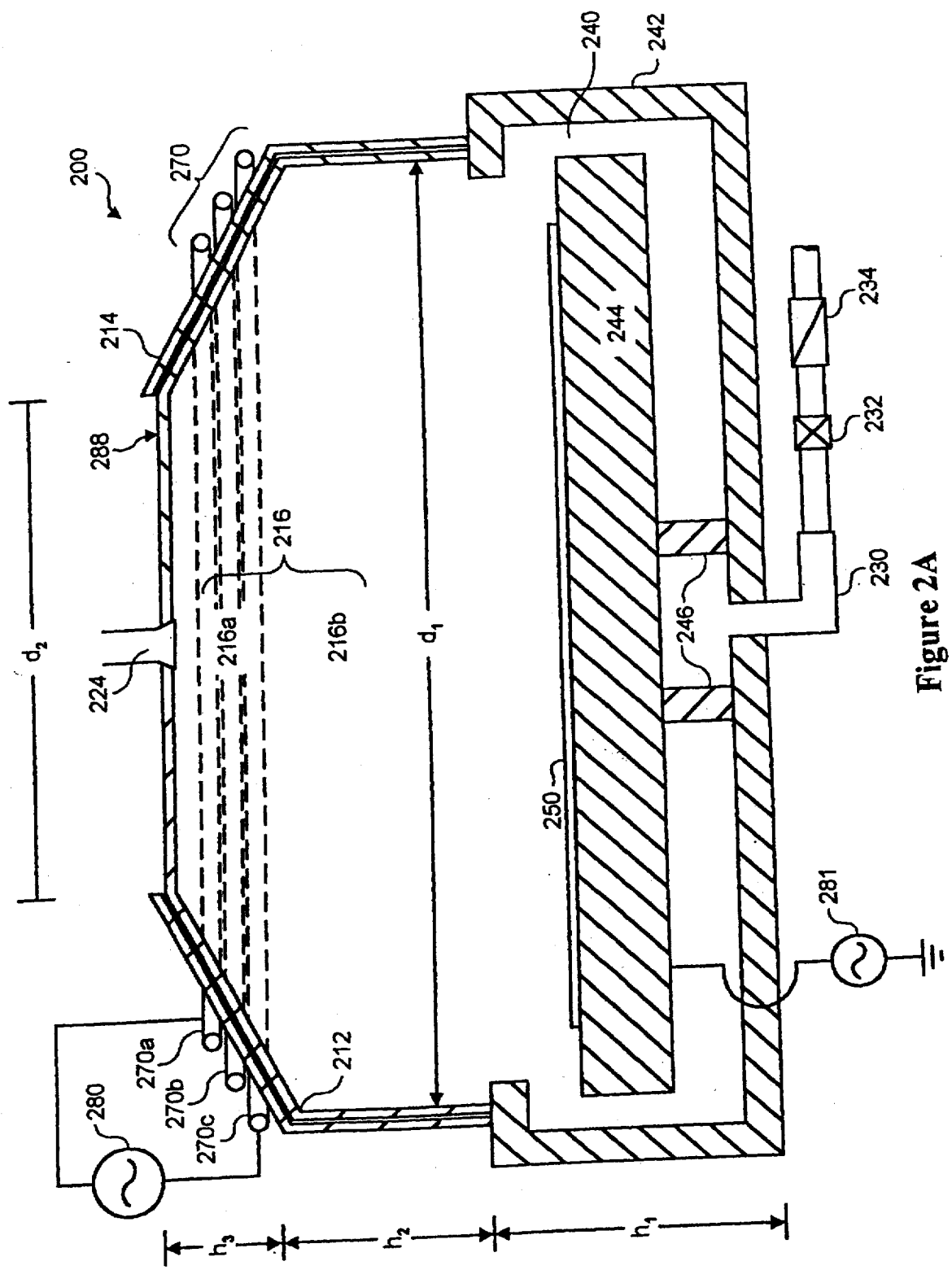
Figure 2B:
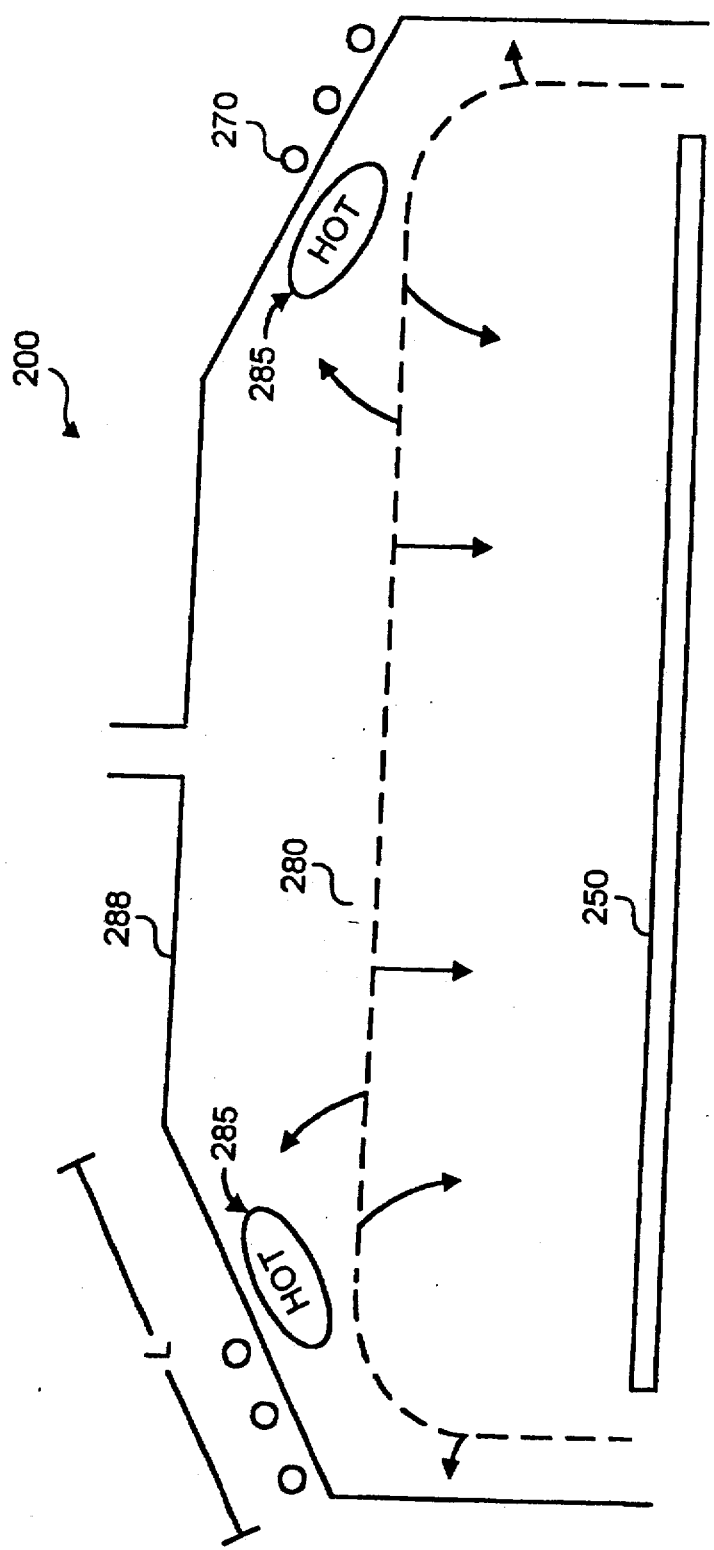
Figure 3:
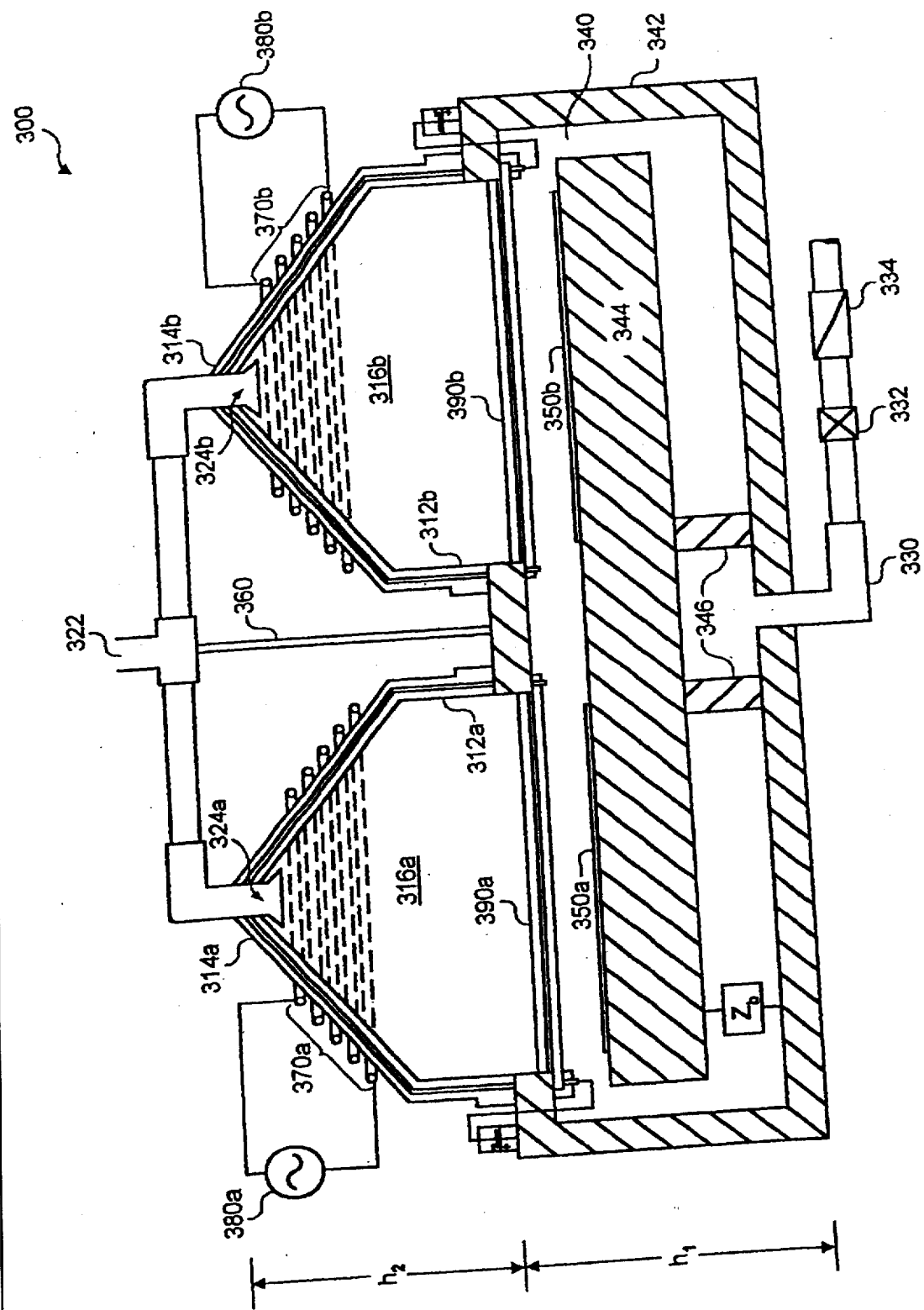

FIG. 5 illustrates a chamber configuration according to alternative embodiment of the present invention. Components that are the same in FIG. 5 as in FIG. 3 are referenced using the same reference numerals. FIG. 5 illustrates an alternative chamber configuration for enhancing power provided to the cent of the chamber. The chambers 516a and b chamber walls 512a and b, split Faraday shields 514a and b and coils 570a and b in FIG. 5 are configured in a shape that is concave from a true cone (which is shown with dashed lines 550 in FIG. 5). The chamber wall and induction coil curve inward closer to the center of the chamber than a true cone. The average distance of the coil from the center of the reactor is thereby reduced. This "concave from conical" configuration helps produce a denser plasma in the center of the chamber and may be useful for very large diameter substrates.

A variety of other configurations may also be used to enhance the plasma in the center of the chamber or alter other plasma characteristics. The chamber and/or induction coil may have a concave from conical shape as shown in FIG. 5, an alternating convex and concave curvature, or multiple conically-shaped sections with different slopes. In particular a variety of parameters, including the cone angle and cone divergence, may be selected to provide a desired configuration. The cone angle is the angle of a cone defined by the conically-shaped section in the reactor. When the chamber section deviates from a true cone, the cone defined by the top and bottom cross-sections is used to define the cone angle. Therefore, the cone angle in FIG. 5 is indicated by the symbol $\alpha$. Any variety of cone angles may be used in reactors according to the present invention, with a general range of from about 5 degrees to 160 degrees, a more specific range of from about 30 degrees to 150 degrees, and a preferred range of from about 90 degrees to 140 degrees, with a cone angle of about 120 degrees being typical.

A chamber section may have a substantially conical shape even though the shape deviates from a true cone shape. In such cases, a cone divergence can be defined which is the distance that a point along the surface forming the chamber section is located from a true cone shape as shown in FIG. 5. The cone divergence may be stated as a percentage of the length of the chamber section or it may be stated as an absolute distance. Usually the cone divergence is less than about 4 cm and is less than thirty percent of the length of a true conical section defined by the top and bottom cross sections of the chamber section. In the reactor of FIG. 5, the cone divergence is about 2.5 cm or about 25% of the length of the conical section. A larger cone divergence may be desirable for chamber sections that are concave from conical (i.e., curve toward the center of the chamber) to enhance the plasma in the center of the chamber. If a chamber is used that is convex (i.e., curves away from the center of the chamber) from conical, the cone divergence is generally small (i.e., less than 10% or 2 cm). For most processes, the chamber section is conically-shaped or very nearly conically-shaped with a cone divergence of less than 5% or 1 cm.

Induction coils usually spiral around the substantially conical chamber section conforming to its shape. The induction coils thereby also define a substantially conically-shaped section (i.e., the shape defined by rotating the coils 360° around a central longitudinal axis). While the induction coil may define a shape similar to the chamber section, the shape may have a slightly different cone angle or cone divergence. The cone angles and cone divergences may be within the same ranges as discussed above for the substantially conically-shaped chamber section. What is desired for most embodiments is a coil configuration that produces activated neutral species at increasing diameters along the conical section. With a substantially conically-shaped induction coil, this is accomplished by virtue of the small diameter turns of the coil near the top of the chamber and increasingly larger diameter turns toward the bottom of the chamber.

Alternative coil configurations may be used in some embodiments to produce activated neutral species throughout the chamber volume. For instance, a substantially cylindrical coil may be used with a varying coil pitch. Toward the top of the conically-shaped plasma chamber (where the chamber diameter is relatively small), the coil may have a high pitch to provide a high level of power to the center of the chamber. The pitch may gradually decrease as the chamber section widens, so less power is provided to the center of the chamber near the bottom of the chamber. The wider sections will allow gas to approach closer to the coil, however, so enough power will be provided at the periphery of the chamber to extend the plasma to a wider diameter while sustaining the plasma in the center of the chamber.

Another approach is to use multiple coils surrounding different portions of the chamber section. The coils may be coupled to power sources having different power levels. Thus, even with coils having the same diameter turns, varying levels of power may be provided to different portions of the plasma generation chamber. For instance a high level of power could be provided to the top coil with gradually decreasing levels of power provided to lower coils. Thus, the coil diameter, pitch, and power level may all be varied to produce the desired plasma characteristics. What is desired is the ability to vary the a level of power applied at different diameters in the plasma generation chamber and at different distances from the substrate surface.

As discussed above, many advantages are realized with an inductively-coupled plasma reactor with a substantially conically-shaped chamber section. For ion enhanced processes, a conically-shaped chamber section may be configured to provide a flat stagnation surface and uniform plasma potential across the wafer surface. For non-ion enhanced processes, varying levels of power can be applied at different chamber diameters. As a result highly uniform ion bombardment or diffusion of activated neutral species can be produced across a large diameter substrate surface.

While the present invention has been described with reference to exemplary embodiments, it will be readily apparent to those skilled in the art that the invention is not limited to the disclosed embodiments but, on the contrary, is intended to cover numerous other modifications and broad equivalent arrangements that are included within the spirit and scope of the following claims.

What is claimed is:

1. An inductively-coupled plasma reactor for processing a substrate comprising:
    a reactor chamber having a cylindrical section and a substantially conical section above the cylindrical section for producing a plasma containing at least one plasma product for processing the substrate, wherein the substantially conical section has a cone angle greater about ninety (90) degrees and less than about one hundred forty (140) degrees and a cone divergence within a range of less than about five (5) percent in a convex direction and less than about twenty five (25) percent in a concave direction;
    a gas inlet coupled to to reactor chamber for providing gas to the reactor chamber;
    a first power source;
    an induction coil coupled to the first power source to couple power from the first power source into the reactor chamber to sustain the plasma, wherein at least a portion of the induction coil is positioned along the substantially conical section;
    the induction coil having up to about five (5) turns and coupling power predominantly through the substantially conical section; and
    a support for the substrate positioned such that the substrate is exposed to the at least one plasma product during processing.

2. The reactor of claim 1, wherein the cone divergence is within the range of less than about five (5) percent in both the convex and concave directions.

3. The reactor of claim 1, wherein the reactor chamber has a top wall substantially perpendicular to the substrate and the induction coil and the reactor chamber provide a substantially flat stagnation surface over the substrate.

4. The reactor of claim 1, wherein the cone angle is about one hundred twenty (120) degrees.

5. The reactor of claim 1, wherein the substantially conical section is truncated and the reactor chamber has a top wall covering the substantially conical section.

6. The reactor of claim 5, wherein the top wall is substantially perpendicular to the substrate.

7. The reactor of claim 5, wherein the top wall curves in a concave direction toward the substrate.

8. The reactor of claim 5, wherein a bottom cross section of the substantially conical section has a diameter greater than a diameter of the substrate and a top cross section of the substantially conical section has a diameter less than the diameter of the substrate.

9. The reactor of claim 8, wherein the diameter of the substrate is at least about 12 inches.

10. The reactor of claim 1, wherein the substantially conical section is positioned above a peripheral region of the substrate and the power coupled from the induction coil provides a high rate of ionization over the peripheral region of the substrate.

11. The reactor of claim 1, wherein the power coupled from the induction coil produces a substantially flat stagnation surface over the substrate.

12. The reactor of claim 1, wherein the induction coil has a plurality of turns adjacent to the reactor chamber and all of the turns are positioned above the cylindrical section.

13. The reactor of claim 12, wherein all of the turns are directly adjacent to the substantially conical section.

14. The reactor of claim 1, wherein the cylindrical section has a height h2 and the substantially conical section has a height h3 and the ratio of h3 to h2 is within the range of form about ¼ to ⅓.

15. The reactor of claim 1, wherein the induction coil has a plurality of turns and each turn has a diameter; and the substantially conical section has a bottom cross section with a diameter larger than the diameter of each turn of the induction coil such that the bottom cross section extends laterally beyond the turns of the induction coil.

16. The reactor of claim 15, wherein the reactor chamber has a top wall substantially perpendicular to the substrate and the induction coil and the reactor chamber provide a substantially flat stagnation surface over the substrate.

17. The reactor of claim 15, wherein the induction coil has between three and five turns adjacent to the substantially conical section.

18. The reactor of claim 1, further comprising a second power source coupled to the support such that a bias is applied to the substrate.

19. The reactor of claim 1, wherein the induction coil has between three and five turns adjacent to the substantially conical section.

20. The reactor of claim 1, wherein the induction coil has a total of between three and five turns adjacent to the reactor chamber.

21. The reactor of claim 2, wherein a bottom cross section of the substantially conical section has a diameter d1 and a top cross section of the substantially conical section has a diameter d2 and the ratio of d2 to d1 is within the range of from about 0.5 to 0.7.

22. The reactor of claim 1, wherein the substantially conical section curves in a concave direction toward the center region of the reaction chamber.

23. The reactor of claim 1, further comprising a split Faraday shield between the induction coil and the reactor chamber.

24. The reactor of claim 2, where the induction coil and the split Faraday shield substantially conform to the shape of the substantially conical section.

25. The reactor of claim 1, wherein the induction coil has a substantially conical shape.

26. The reactor of claim 1, wherein the substrate has a diameter substantially greater than 8 inches and the induction coil and the reactor chamber provide a substantially flat stagnation surface over the substrate.

27. The reactor of claim 1, wherein the at least one plasma product comprises dissociated species and the power coupled from the induction coil along the substantially conical section produces abundant dissociated species at varying diameters in the reaction chamber such that the dissociated species diffuse substantially uniformly over the substrate.

28. The reactor of claim 27, wherein the substrate has a diameter substantially greater than 8 inches.

29. A method for processing a substrate comprising the steps of:

providing a reactor chamber having a substantially conical section, wherein the substantially conical section has a cone angle greater than about ninety (90) degrees and less than about one hundred forty (140) degrees and a cone divergence within the range of less than about five (5) percent in a convex direction and less than about twenty five (25) percent in a concave direction;

using an induction coil with up to about five (5) turns to inductively couple power into the reactor chamber predominantly through the substantially conical section to produce at least one plasma product for processing the substrate; and exposing the substrate to the at least one plasma product for processing.

30. The method of claim 29, further comprising the step of producing a substantially flat stagnation surface over the substrate.

31. The method of claim 29, wherein the step of inductively coupling power further comprises the step of inductively coupling power from an induction coil adjacent to the substantially conical section which has a lateral extent less than a bottom cross section of the substantially conical section.

32. The method of claim 29, further comprising the step of coupling power to a support for the substrate.

33. The method of claim 29, wherein the at least one plasma product comprises dissociated species and further comprising the step of coupling power along the substantially conical section to produce abundant dissociated species at varying diameters in the reaction chamber such that the dissociated species diffuse substantially uniformly over the substrate.

34. The method of claim 33, wherein the substrate has a diameter substantially greater than 8 inches.

\* \* \* \* \*

UNITED STATES PATENT AND TRADEMARK OFFICE
CERTIFICATE OF CORRECTION

PATENT NO. : 5,964,949
DATED : October 12, 1999
INVENTOR(S) : Stephen E. Savas

It is certified that error appears in the above-identified patent and that said Letters Patent is hereby corrected as shown below:

The title page should be deleted to appear as per attached title page.

The sheets of drawings consisting of figures 1-5 should be deleted to appear as per attached figures 1-5.

Signed and Sealed this

Eighteenth Day of December, 2001

Attest:

*Attesting Officer*

JAMES E. ROGAN
*Director of the United States Patent and Trademark Office*

U.S. Patent
Nov. 23, 1999
5,989,838

[54] ICP REACTOR HAVING A CONICALLY-SHAPED PLASMA-GENERATING SECTION

[75] Inventor: Stephen E. Savas, Alameda, Calif.

[73] Assignee: Mattson Technology, Inc., Fremont, Calif.

[21] Appl. No.: 08/811,893

[22] Filed: Mar. 5, 1997

Related U.S. Application Data

[60] Provisional application No. 60/012,932, Mar. 6, 1996.

[51] Int. Cl.$^6$ .......................................... C23C 16/00
[52] U.S. Cl. .................................... 118/723 I; 156/345
[58] Field of Search ..................... 118/723 R, 723 I, 118/723 IR, 723 E, 723 ER, 723 AN; 156/345; 315/111.51

[56] References Cited

U.S. PATENT DOCUMENTS

| | | | |
|---|---|---|---|
| 4,948,458 | 8/1990 | Ogle | 156/643 |
| 5,234,529 | 8/1993 | Johnson | 156/345 |
| 5,280,154 | 1/1994 | Cuomo et al. | 219/121.52 |
| 5,346,578 | 9/1994 | Benzing et al. | 156/345 |
| 5,401,350 | 3/1995 | Patrick et al. | 156/345 |
| 5,405,480 | 4/1995 | Benzing et al. | 156/345 |
| 5,449,432 | 9/1995 | Hanawa | 156/345 |
| 5,540,800 | 7/1996 | Qian | 156/345 |
| 5,540,824 | 7/1996 | Yin et al. | 204/298.34 |
| 5,556,521 | 9/1996 | Ghanbari | 204/192.32 |
| 5,558,722 | 9/1996 | Okumura et al. | 118/723 I |
| 5,565,074 | 10/1996 | Qian et al. | 204/298.08 |
| 5,571,366 | 11/1996 | Ishii et al. | 156/345 |
| 5,614,055 | 3/1997 | Fairbairn et al. | 156/345 |
| 5,647,913 | 7/1997 | Blalock | 118/723 I |
| 5,683,539 | 11/1997 | Qian et al. | 156/345 |
| 5,688,357 | 11/1997 | Hanawa | 156/345 |
| 5,690,781 | 11/1997 | Yoshida et al. | 156/345 |
| 5,696,428 | 12/1997 | Pasch | 315/111.21 |
| 5,710,486 | 1/1998 | Ye et al. | 315/111.21 |
| 5,753,044 | 5/1998 | Hanawa et al. | 118/723 I |
| 5,777,289 | 7/1998 | Hanawa et al. | 219/121.43 |
| 5,811,022 | 9/1998 | Savas et al. | 216/68 |

FOREIGN PATENT DOCUMENTS

| | | | |
|---|---|---|---|
| 0 694 949 A2 | 1/1996 | European Pat. Off. | H01J 37/32 |
| 6-196446 | 7/1994 | Japan . | |
| WO 91/10341 | 7/1991 | WIPO | H05H 1/24 |

OTHER PUBLICATIONS

Corresponding PCT application No. PCT/US97/04756 filed Mar. 5, 1997. PCT International Search Report, citing the above-listed references.

N. Shoda et al., "Water Absorption Study of High Density Plasma CVD Oxide Films," Feb. 20–21, 1996 DUMIC Conference, 1996 ISMIC—111D/96/0013.

M. Tuszewski et al., "Composition of the oxygen plasmas from two inductively coupled sources," J. Vac. Sci. Technol. A 13(3), May/Jun. 1995, pp. 839–842.

P. N. Wainman et al., "Characterization at different aspect ratios (radius/length) of a radio frequency inductively coupled plasma source," J. Vac. Sci. Technol. A 13(5), Sep./Oct. 1995, pp. 2464–2469.

*Primary Examiner*—Bruce Breneman
*Assistant Examiner*—Luz Alejandro
*Attorney, Agent, or Firm*—Wilson Sonsini Goodrich & Rosati

[57] ABSTRACT

Disclosed is an inductively-coupled plasma reactor that is useful for anisotropic or isotropic etching of a substrate, or chemical vapor deposition of a material onto a substrate. The reactor has a plasma-generation chamber with a conically-shaped plasma-generating portion and coils that are arranged around the plasma-generating portion in a conical spiral. The chamber and coil may be configured to produce a highly uniform plasma potential across the entire surface of the substrate to promote uniform ion bombardment for ion enhanced processing. In addition, a conical chamber and coil configuration may be used to produce activated neutral species at varying diameters in a chamber volume for non-ion enhanced processing. Such a configuration promotes the uniform diffusion of the activated neutral species across the wafer surface.

34 Claims, 8 Drawing Sheets

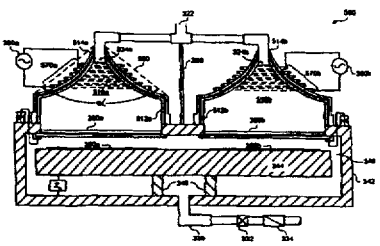
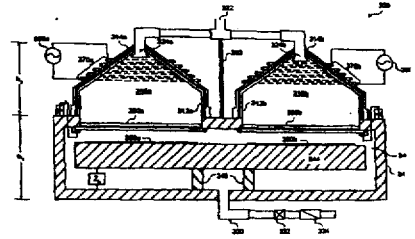

UNITED STATES PATENT AND TRADEMARK OFFICE
CERTIFICATE OF CORRECTION

PATENT NO.     : 5,964,949
DATED          : October 12, 1999
INVENTOR(S)    : Savas It is certified that error appears in the above-identified patent and that said Letters Patent is hereby corrected as shown below:

Drawings,
Figures 6A, 6B, 7A, 7B, 8 and 9, should be deleted in their entirety.

Signed and Sealed this

Fifteenth Day of July, 2003

JAMES E. ROGAN
*Director of the United States Patent and Trademark Office*